United States Patent
Araki et al.

(10) Patent No.: US 6,657,828 B2
(45) Date of Patent: Dec. 2, 2003

(54) MAGNETIC TRANSDUCER WITH A HIGHER RATE AND LARGER MAGNITUDE OF RESISTANCE CHANGE

(75) Inventors: Satoru Araki, Tokyo (JP); Yoshihiro Tsuchiya, Tokyo (JP); Masashi Sano, Tokyo (JP); Takumi Uesugi, Tokyo (JP)

(73) Assignee: TDK Corporation, Tokyo (JP)

(*) Notice: Subject to any disclaimer, the term of this patent is extended or adjusted under 35 U.S.C. 154(b) by 259 days.

(21) Appl. No.: 09/774,644

(22) Filed: Feb. 1, 2001

(65) Prior Publication Data

US 2001/0020884 A1 Sep. 13, 2001

(30) Foreign Application Priority Data

Feb. 3, 2000 (JP) .......................... 2000-032674

(51) Int. Cl.$^7$ ................................. G11B 5/39

(52) U.S. Cl. .................................... 360/324.1

(58) Field of Search ........................ 360/324.1, 324.12

(56) References Cited

U.S. PATENT DOCUMENTS

| | | | |
|---|---|---|---|
| 5,422,571 A | | 6/1995 | Gurney et al. |
| 6,074,743 A | * | 6/2000 | Araki ........................ 360/324.1 |
| 6,127,053 A | * | 10/2000 | Lin .......................... 360/324.1 |

FOREIGN PATENT DOCUMENTS

| | | |
|---|---|---|
| JP | 2001-184613 | 7/2001 |
| JP | 2001-189503 | 7/2001 |
| JP | 2001-195710 | 7/2001 |

OTHER PUBLICATIONS

Y. Kamiguchi et al., "CoFe Specular Spin Valves with a Nano Oxide Layer", *Digests of INTERMAG 99* (DB–01).

M. Ueno et al., "Read–Write Performance of the Spin–Filter–Spin–Valve Heads", *Digest of the 23$^{rd}$ Annual Conference on Magnetics*, p. 402, Japan 1999 (with translation).

* cited by examiner

*Primary Examiner*—A. J. Heinz
(74) *Attorney, Agent, or Firm*—Oliff & Berridge, PLC

(57) ABSTRACT

Provided are a magnetic transducer having a higher rate of resistance change and a larger magnitude of resistance change and having better stability of properties, and a thin film magnetic head. A stack of an MR element has a stacked structure comprising an underlayer, an antiferromagnetic layer, a ferromagnetic layer, a first nonmagnetic layer, a first soft magnetic layer, a second soft magnetic layer, a second nonmagnetic layer and a high-resistance layer, which are stacked in sequence on the underlayer. The orientation of magnetization of the ferromagnetic layer is fixed by exchange coupling between the ferromagnetic layer and the antiferromagnetic layer. The orientations of magnetizations of the first soft magnetic layer and the second soft magnetic layer change according to an external magnetic field. Electrical resistance of the stack changes according to a relative angle between the orientations of the magnetizations of the first soft magnetic layer and the second soft magnetic layer and the orientation of the magnetization of the ferromagnetic layer. The high-resistance layer has higher electrical resistance than electrical resistance of the second nonmagnetic layer. The second nonmagnetic layer and the high-resistance layer are provided on the side of the second soft magnetic layer opposite to the first nonmagnetic layer. Thus, the rate of resistance change and the magnitude of resistance change can be increased, and furthermore stability of properties can be improved.

12 Claims, 18 Drawing Sheets

MAGNETIC TRANSDUCER WITH A HIGHER RATE AND LARGER MAGNITUDE OF RESISTANCE CHANGE

BACKGROUND OF THE INVENTION

1. Field of the Invention

The invention relates to a magnetic transducer and a thin film magnetic head using the same. More particularly, the invention relates to a magnetic transducer which can obtain a higher rate of resistance change and a larger magnitude of resistance change and also has higher stability of properties, and a thin film magnetic head using the magnetic transducer.

2. Description of the Related Art

Recently, an improvement in performance of a thin film magnetic head has been sought in accordance with an increase in a surface recording density of a hard disk or the like. A composite thin film magnetic head, which has a stacked structure comprising a reproducing head having a magnetoresistive element (hereinafter referred to as an MR element) that is a type of magnetic transducer and a recording head having an inductive magnetic transducer, is widely used as the thin film magnetic head.

MR elements include an AMR element using a magnetic film (an AMR film) exhibiting an anisotropic magnetoresistive effect (an AMR effect), a GMR element using a magnetic film (a GMR film) exhibiting a giant magnetoresistive effect (a GMR effect), and so on.

The reproducing head using the AMR element is called an AMR head, and the reproducing head using the GMR element is called a GMR head. The AMR head is used as the reproducing head whose surface recording density exceeds 1 Gbit/inch$^2$, and the GMR head is used as the reproducing head whose surface recording density exceeds 3 Gbit/inch$^2$.

As the GMR film, a "multilayered (antiferromagnetic)" film, an "inductive ferrimagnetic" film, a "granular" film, a "spin valve" film and the like are proposed. Of these types of films, the spin valve type GMR film is considered to have a relatively simple structure, to exhibit a great change in resistance even under a low magnetic field and to be suitable for mass production.

FIG. 20 shows the structure of a general spin valve type GMR film (hereinafter referred to as a spin valve film). A surface indicated by reference symbol S in FIG. 20 corresponds to a surface facing a magnetic recording medium. The spin valve film has a stacked structure comprising an underlayer 801, a soft magnetic layer 802, a nonmagnetic layer 803, a ferromagnetic layer 804, an antiferromagnetic layer 805 and a cap layer 806, which are stacked in this order on the underlayer 801. In the spin valve film, the orientation of magnetization Mp of the ferromagnetic layer 804 is fixed by exchange coupling between the ferromagnetic layer 804 and the antiferromagnetic layer 805. The orientation of magnetization Mf of the soft magnetic layer 802 freely changes according to an external magnetic field. Resistance of the spin valve film changes according to a relative angle between the orientation of the magnetization Mp of the ferromagnetic layer 804 and the orientation of the magnetization Mf of the soft magnetic layer 802.

In recent years, magnetic recording at ultra-high density in excess of 20 Gbit/inch$^2$ has required a further increase of the rate of change in electrical resistance of the spin valve film (hereinafter referred to as the rate of resistance change). Moreover, the increase of output of the thin film magnetic head has required the increase of the amount of change in resistance of the spin valve film (hereinafter referred to as the magnitude of resistance change). Reducing a thickness of the soft magnetic layer enables increasing the rate of resistance change and the magnitude of resistance change. However, there is a problem that output variations occur and properties such as output symmetry are not stable.

Therefore, the rate of resistance change is increased by inserting an oxide film called NOL into a ferromagnetic layer of a spin valve film, which is proposed in the cited reference "CoFe specular spin valves with a nano oxide layer", 1999 Digests of INTERMAG 99, published on May 18, 1999 (hereinafter referred to as the cited reference 1). Moreover, a back-layer made of Cu (copper) is provided on the side of a soft magnetic layer opposite to a nonmagnetic layer, which is proposed in, for example, the cited reference "Read-write performance of the spin-filter-spin-valve heads", p. 402, the Proceedings of the Annual Meeting of THE MAGNETICS SOCIETY OF JAPAN (hereinafter referred to as the cited reference 2). Similarly, a back-layer made of nonmagnetic metal is provided on the side of a soft magnetic layer opposite to a nonmagnetic layer, which is proposed in U.S. Pat. No. 5,422,571 (hereinafter referred to as the cited reference 3).

However, the above-mentioned cited reference 1 gives no descriptions about specific conditions such as a material and thickness of the oxide film called NOL and a position into which the oxide film is to be inserted, and any properties other than the rate of resistance change. It is therefore necessary to study these conditions and properties. Moreover, methods described in the above-mentioned cited references 2 and 3 have a problem that the magnitude of resistance change cannot be sufficiently increased.

SUMMARY OF THE INVENTION

The invention is designed to overcome the foregoing problems. It is an object of the invention to provide a magnetic transducer which can obtain a higher rate of resistance change and a larger magnitude of resistance change and also has higher stability of properties, and a thin film magnetic head using the magnetic transducer.

A magnetic transducer of the invention comprises: a first nonmagnetic layer having a pair of surfaces opposing each other; a soft magnetic layer formed on one surface of the first nonmagnetic layer; a ferromagnetic layer formed on the other surface of the first nonmagnetic layer; an antiferromagnetic layer formed on the ferromagnetic layer on the side opposite to the first nonmagnetic layer; a second nonmagnetic layer formed on the soft magnetic layer on the side opposite to the first nonmagnetic layer; and a high-resistance layer located on the second nonmagnetic layer on the side opposite to the soft magnetic layer and made of a material having resistivity of 200 $\mu\Omega$·cm or more.

In the magnetic transducer of the invention, the high-resistance layer is located on the second nonmagnetic layer on the side opposite to the soft magnetic layer and is made of a material having resistivity of 200 $\Omega$·cm or more. Therefore, the rate of resistance change and the magnitude of resistance change are increased, and stability of properties is also improved.

Preferably, the high-resistance layer contains at least one element in a group consisting of Al (aluminum), Cr (chromium), Ti (titanium), Ru (ruthenium), Mn (manganese), Rh (rhodium), Ag (silver), Pd (palladium), Ni (nickel), Cu (copper), Co (cobalt), Fe (iron), Re (rhenium) and Ta (tantalum), and at least one element in a group consisting of O (oxygen) and N (nitrogen). More preferably, the high-resistance layer contains at least one element in a group consisting of Al, Cr, Ti, Ru, Mn and Rh.

Preferably, a thickness of the high-resistance layer is from 0.5 nm to 30 nm inclusive. Preferably, the second nonmagnetic layer contains at least one element in a group consisting of Au (gold), Ag (silver), Cu, Ru, Rh, Re, Pt (platinum) and W (tungsten). Preferably, a thickness of the second nonmagnetic layer is from 0.5 nm to 2 nm inclusive.

Preferably, the ferromagnetic layer can have two magnetizations which are opposite each other in direction. Preferably, the ferromagnetic layer includes a ferromagnetic inner layer, an ferromagnetic outer layer, and a coupling layer sandwiched between the ferromagnetic inner layer and the ferromagnetic outer layer. More preferably, a magnetic interlayer having higher electrical resistance than that of at least a part of the ferromagnetic layer is provided in the ferromagnetic layer. Preferably, a thickness of the soft magnetic layer is from 1 nm to 6 nm inclusive.

A thin film magnetic head of the invention has the above-described magnetic transducer.

Another thin film magnetic head of the invention has a magnetic transducer between a pair of magnetic layers with a pair of gap layers in between, the magnetic transducer comprising: a first nonmagnetic layer having a pair of surfaces opposing each other; a soft magnetic layer formed on one surface of the first nonmagnetic layer; a ferromagnetic layer formed on the other surface of the first nonmagnetic layer; an antiferromagnetic layer formed on the ferromagnetic layer on the side opposite to the first nonmagnetic layer; a second nonmagnetic layer formed on the soft magnetic layer on the side opposite to the first nonmagnetic layer, wherein one of the pair of gap layers is located on the second nonmagnetic layer and is made of a material having resistivity of 200 $\mu\Omega$·cm or more.

Other and further objects, features and advantages of the invention will appear more fully from the following description.

DETAILED DESCRIPTION OF THE PREFERRED EMBODIMENTS

[First Embodiment]

<Structures of MR Element and Thin Film Magnetic Head>

Firstly, the description is given with reference to FIGS. 1 to 7 with regard to the structures of an MR element that is a specific example of a magnetic transducer according to a first embodiment of the invention and a thin film magnetic head using the MR element.

Figure 1:
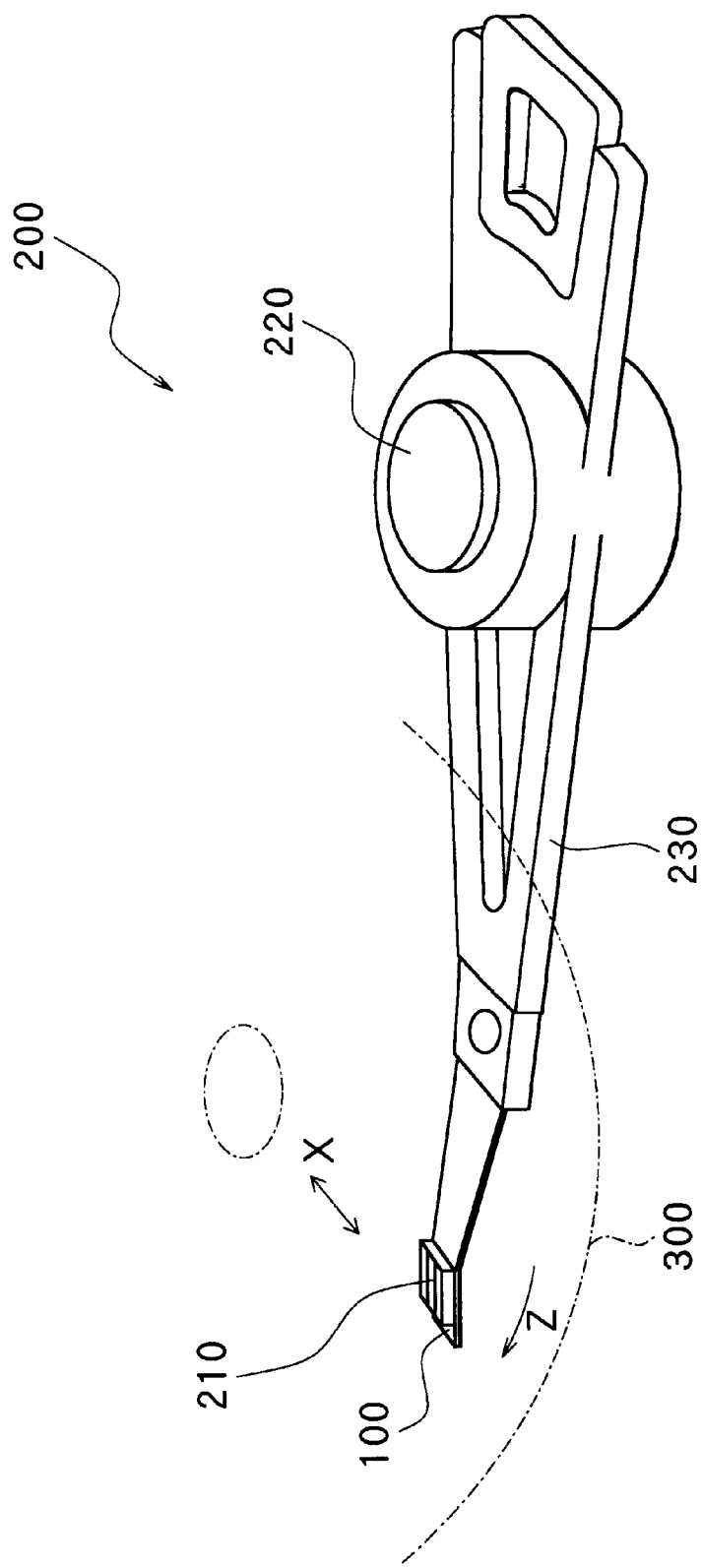
FIG. 1 is a perspective view of a configuration of an actuator arm comprising a thin film magnetic head including a magnetic transducer according to a first embodiment of the invention.

FIG. 1 shows the configuration of an actuator arm 200 comprising a thin film magnetic head 100 according to the embodiment. The actuator arm 200 is used in a hard disk drive (not shown) or the like, for example. The actuator arm 200 has a slider 210 on which the thin film magnetic head 100 is formed. For example, the slider 210 is mounted on the end of an arm 230 rotatably supported by a supporting pivot 220. The arm 230 is rotated by a driving force of a voice coil motor (not shown), for example. Thus, the slider 210 moves in a direction x in which the slider 210 crosses a track line along a recording surface of a magnetic recording medium 300 such as a hard disk (a lower surface of the recording surface in FIG. 1). For example, the magnetic recording medium 300 rotates in a direction z substantially perpendicular to the direction x in which the slider 210 crosses the track line. The magnetic recording medium 300 rotates and the slider 210 moves in this manner, whereby information is recorded on the magnetic recording medium 300 or recorded information is read out from the magnetic recording medium 300.

Figure 2:
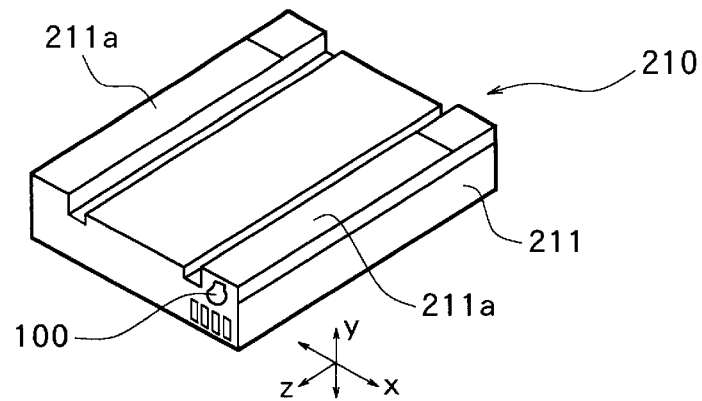
FIG. 2 is a perspective view of a configuration of a slider of the actuator arm shown in FIG. 1.

FIG. 2 shows the configuration of the slider 210 shown in FIG. 1. The slider 210 has a block-shaped base 211 made of $Al_2O_3$—TiC (altic), for example. The base 211 is substantially hexahedral, for instance. One face of the hexahedron closely faces the recording surface of the magnetic recording medium 300 (see FIG. 1). A surface facing the recording surface of the magnetic recording medium 300 is called an air bearing surface (ABS) 211a. When the magnetic recording medium 300 rotates, airflow generated between the recording surface of the magnetic recording medium 300 and the air bearing surface 211a allows the slider 210 to slightly move away from the recording surface in a direction y opposite to the recording surface. Thus, a constant clearance is created between the air bearing surface 211a and the magnetic recording medium 300. The thin film magnetic head 100 is provided on one side (the left side in FIG. 2) adjacent to the air bearing surface 211a of the base 211.

Figure 3:
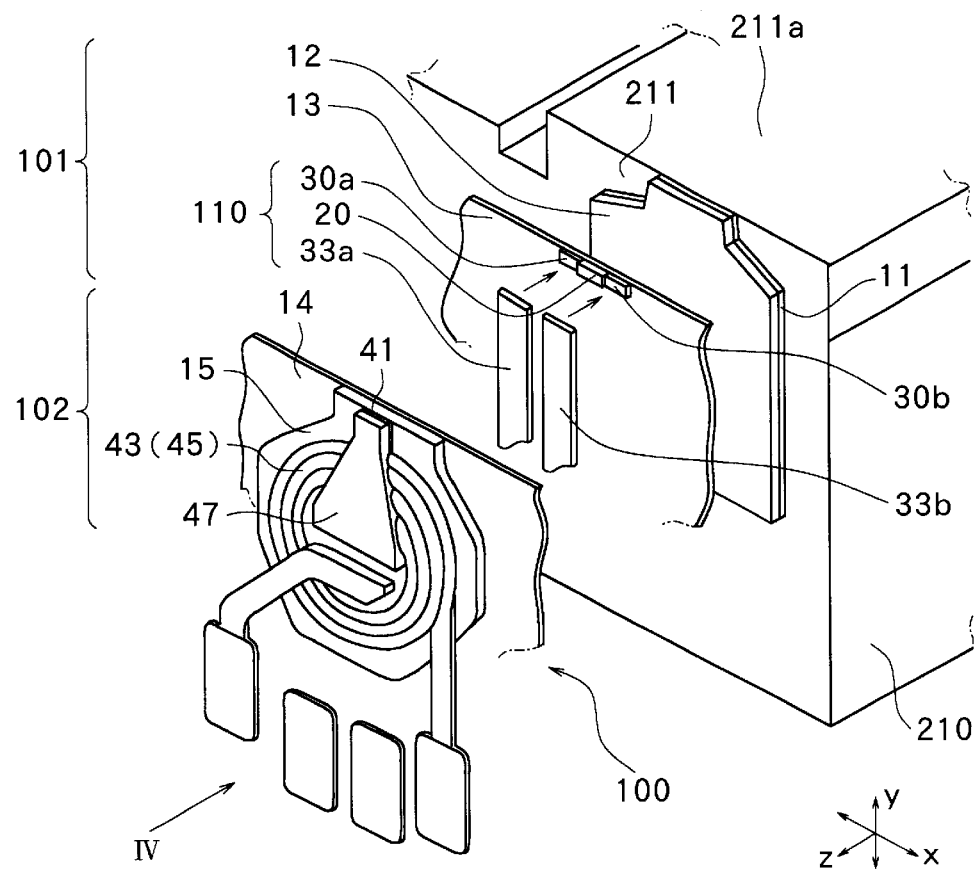
FIG. 3 is an exploded perspective view of a structure of the thin film magnetic head according to the first embodiment.
Figure 4:
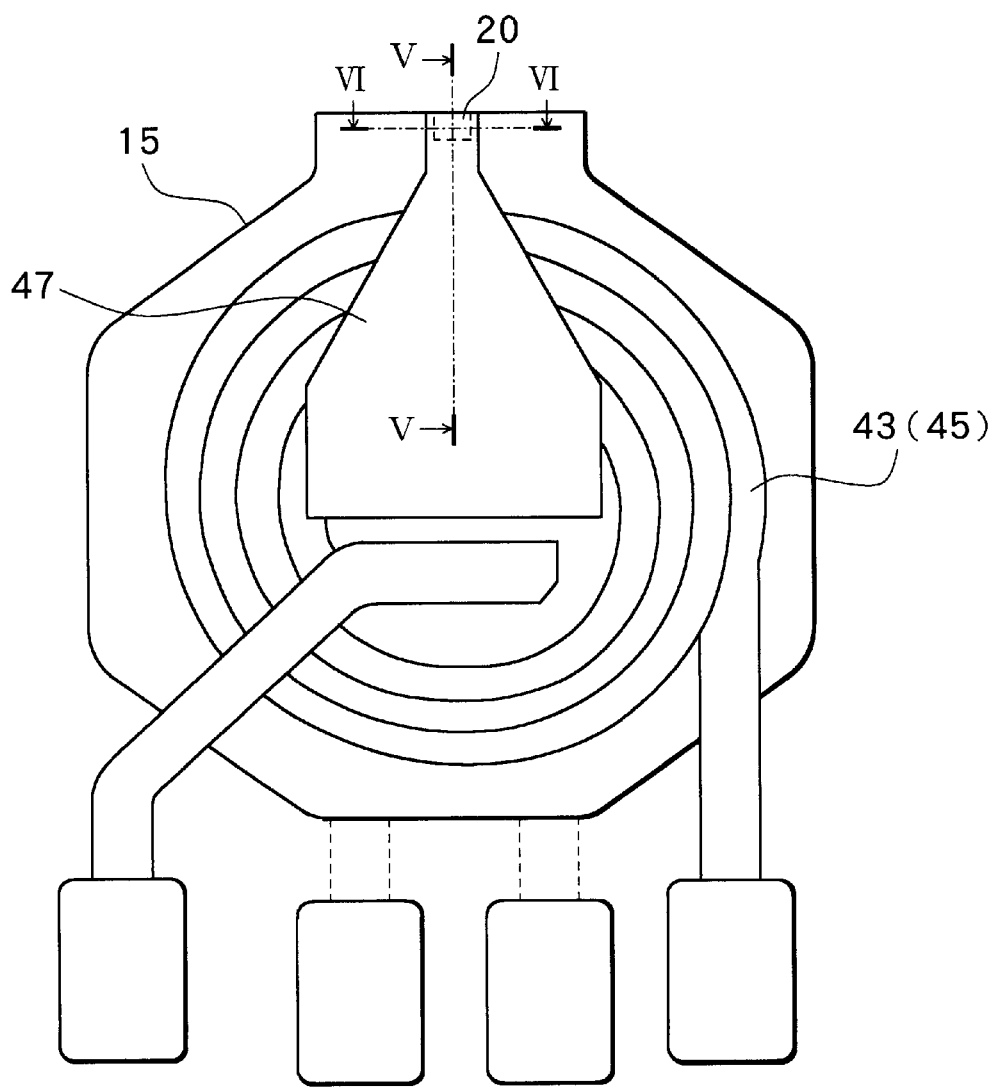
FIG. 4 is a plan view of the thin film magnetic head shown in FIG. 3, showing the structure thereof viewed from the direction of the arrow IV of FIG. 3.
Figure 4:
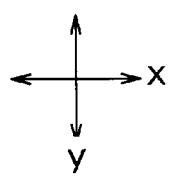
Figure 5:
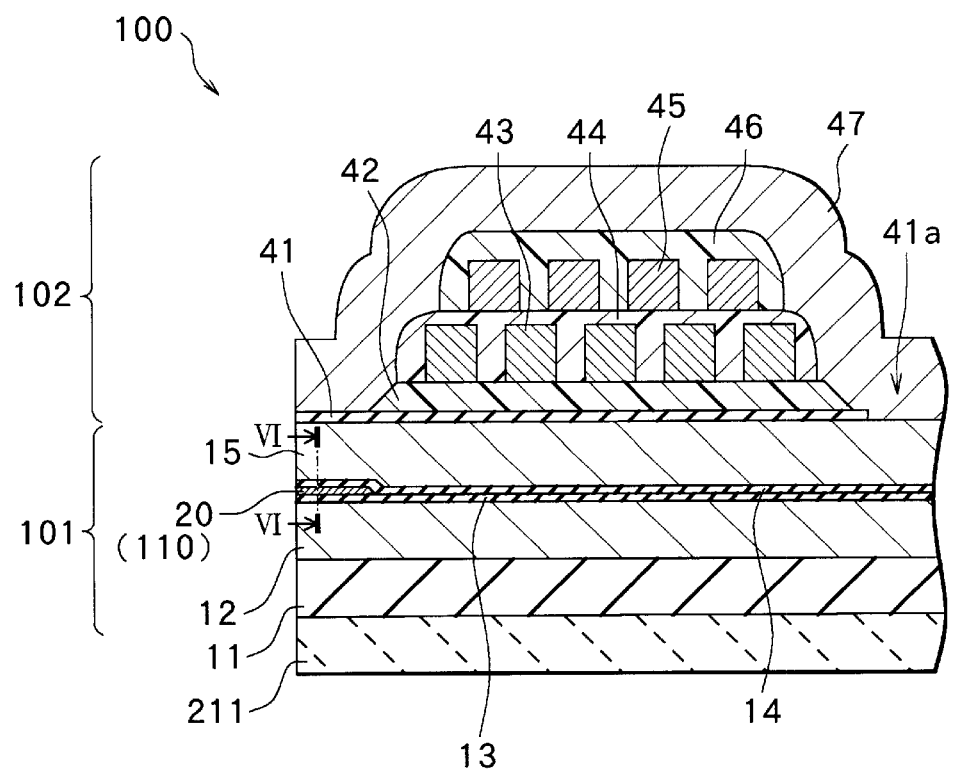
FIG. 5 is a sectional view of the thin film magnetic head shown in FIG. 3, showing the structure thereof viewed from the direction of the arrows along the line V—V of FIG. 4.
Figure 6:
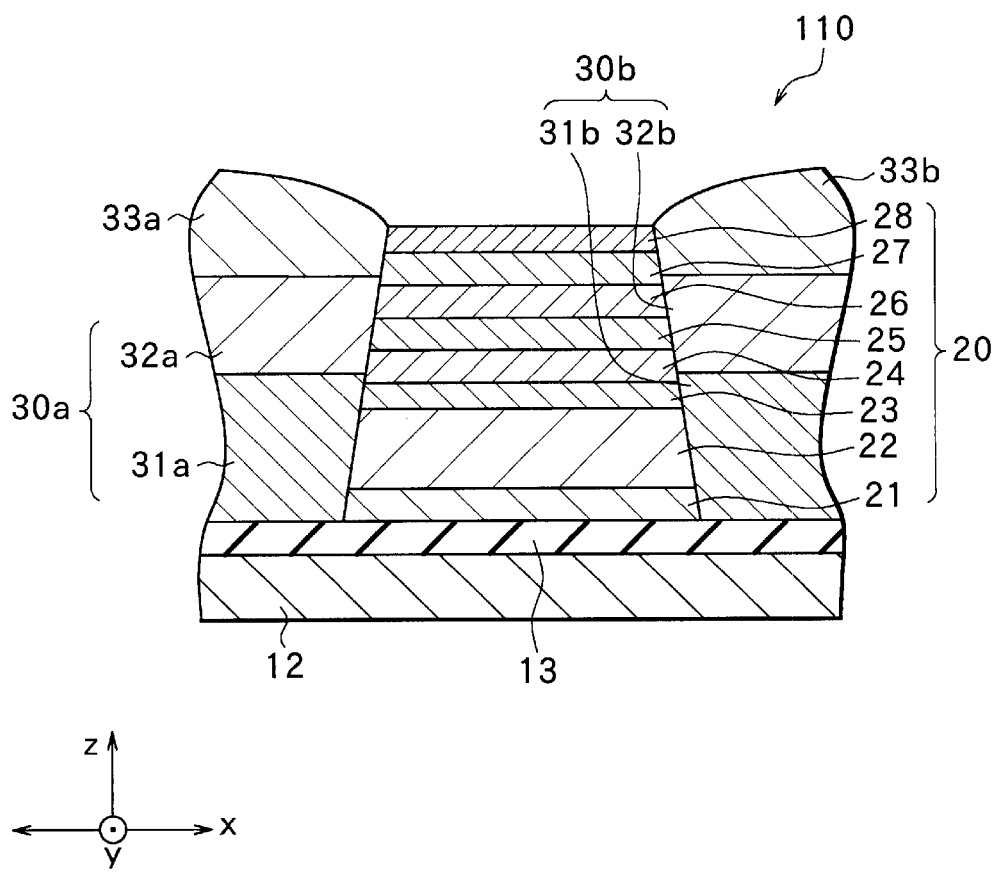
FIG. 6 is a sectional view of the thin film magnetic head shown in FIG. 3, showing the structure thereof viewed from the direction of the arrows along the line VI—VI of FIG. 4, i.e., the structure thereof viewed from the direction of the arrows along the line VI—VI of FIG. 5.
Figure 7:
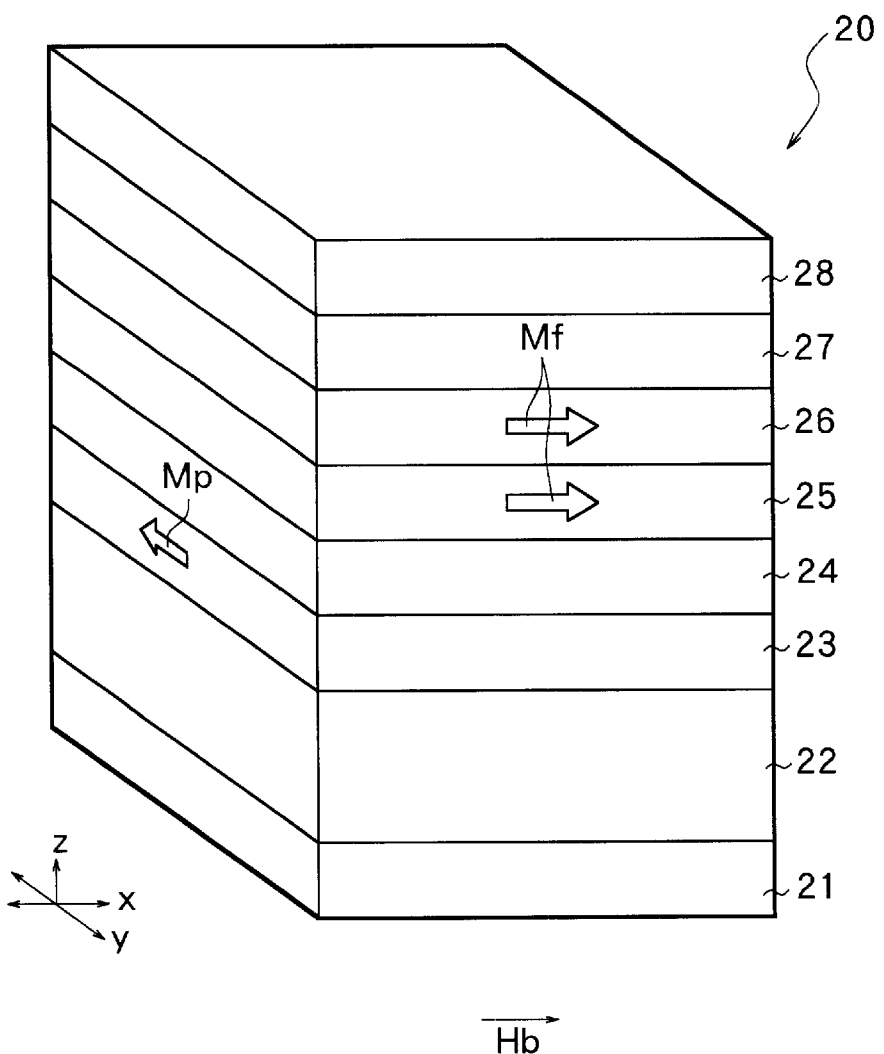
FIG. 7 is a perspective view of a structure of a stack of the magnetic transducer shown in FIG. 6.

FIG. 3 is an exploded view of the structure of the thin film magnetic head 100. FIG. 4 shows a planar structure viewed from the direction of the arrow IV of FIG. 3. FIG. 5 shows a sectional structure viewed from the direction of the arrows along the line V—V of FIG. 4. FIG. 6 shows a sectional structure viewed from the direction of the arrows along the line VI—VI of FIG. 4, i.e., the direction of the arrows along the line VI—VI of FIG. 5. FIG. 7 shows a part of the structure shown in FIG. 6. The thin film magnetic head 100 has an integral structure comprising a reproducing head 101 for reproducing magnetic information recorded on the magnetic recording medium 300 and a recording head 102 for recording magnetic information on the track line of the magnetic recording medium 300.

As shown in FIGS. 3 and 5, for example, the reproducing head 101 has a stacked structure comprising an insulating layer 11, a first magnetic layer 12, a first gap layer 13, a second gap layer 14 and a second magnetic layer 15, which are stacked in this order on the base 211 close to the air bearing surface 211a. For example, the insulating layer 11 is 2 μm to 10 μm in thickness along the direction of stack (hereinafter referred to as a thickness) and is made of $Al_2O_3$ (aluminum oxide). For example, the first magnetic layer 12 is 1 μm to 3 μm in thickness and is made of a magnetic material such as NiFe (nickel-iron alloy). For example, the first gap layer 13 and the second gap layer 14 are each 10 nm to 100 nm in thickness and are made of $Al_{2O3}$ or AlN (aluminum nitride). For example, the second magnetic layer 15 is 1 μm to 4 μm in thickness and is made of a magnetic material such as NiFe. The first magnetic layer 12 and the second magnetic layer 15 are layers for reducing an influence of an external magnetic field on a stack 20 to be described later. The second magnetic layer 15 also functions as a bottom pole of the recording head 102.

An MR element 110 including the stack 20 comprising a spin valve film is sandwiched in between the first gap layer 13 and the second gap layer 14. The reproducing head 101 reads out information recorded on the magnetic recording medium 300 by utilizing electrical resistance of the stack 20 changing according to a signal magnetic field from the magnetic recording medium 300.

For example, as shown in FIGS. 6 and 7, the stack 20 has a stacked structure comprising an underlayer 21, an antiferromagnetic layer 22, a ferromagnetic layer 23, a first nonmagnetic layer 24, a first soft magnetic layer 25, a second soft magnetic layer 26, a second nonmagnetic layer 27 and a high-resistance layer 28, which are stacked in this order on the first gap layer 13. For example, the underlayer 21 is 5 nm in thickness and is made of Ta. For instance, the underlayer 21 may have a stacked structure comprising a Ta film of 3 nm thick and a NiFe film of 2 nm thick, which are stacked in this order.

For example, the antiferromagnetic layer 22 is 5 nm to 30 nm in thickness and is made of an antiferromagnetic material containing at least one element $M_I$ in a group consisting of Pt, Ru, Rh, Pd, Ni, Au, Ag, Cu, Ir (iridium), Cr and Fe, and Mn. Preferably, the percentage of content of Mn is from 45 atom % to 95 atom % inclusive, and the percentage of content of the other element $M_I$ is from 5 atom % to 65 atom % inclusive. Antiferromagnetic materials include a non-heat-treatment type antiferromagnetic material which exhibits antiferromagnetism without heat treatment and induces an exchange coupling magnetic field between the antiferromagnetic material and a ferromagnetic material, and a heat-treatment type antiferromagnetic material which exhibits antiferromagnetism with heat treatment. The antiferromagnetic layer 22 may be made of either the non-heat-treatment type antiferromagnetic material or the heat-treatment type antiferromagnetic material.

Non-heat-treatment type antiferromagnetic materials include Mn alloy having γ-phase, and so on. Specifically, RuRhMn (ruthenium-rhodium-manganese alloy), FeMn (iron-manganese alloy), IrMn (iridium-manganese alloy) and the like are included. Heat-treatment type antiferromagnetic materials include Mn alloy having regular crystal structures, and so on. Specifically, PtMn (platinum-manganese alloy), NiMn (nickel-manganese alloy), PtRhMn (platinum-rhodium-manganese alloy) and the like are included.

For example, the ferromagnetic layer 23 is 2 nm to 4.5 nm in thickness and is made of a magnetic material containing at least Co in a group consisting of Co and Fe. Preferably, the ferromagnetic layer 23 is made of a magnetic material having the (111) plane oriented in the direction of stack. The ferromagnetic layer 23 is sometimes called a pinned layer, and the orientation of magnetization thereof is fixed by exchange coupling on an interface between the ferromagnetic layer 23 and the antiferromagnetic layer 22. In the embodiment, the orientation of the magnetization of the ferromagnetic layer 23 is fixed in the y-direction.

For example, the first nonmagnetic layer 24 is 1.8 nm to 3.0 nm in thickness and is made of a nonmagnetic material containing at least one element in a group consisting of Au, Ag, Cu, Ru, Rh, Re, Pt and W, and the percentage of content of the at least one element is 80 wt % or more. The first nonmagnetic layer 24 is a layer for magnetically isolating the first soft magnetic layer 25 and the second soft magnetic layer 26 from the ferromagnetic layer 23 and the antiferromagnetic layer 22 as much as possible.

For example, the first soft magnetic layer 25 is 0.5 nm to 3 nm in thickness and is made of a magnetic material containing at least Co in a group consisting of Ni, Co and Fe. Specifically, it is preferable that the first soft magnetic layer 25 is made of $Co_xFe_yNi_{100-(x+y)}$ having the (111) plane oriented in the direction of stack, where x and y are within a range of $70 \leq x \leq 100$ and $0 \leq y \leq 25$ in units of atom %, respectively. For example, the second soft magnetic layer 26 is 1 nm to 3 nm in thickness and is made of a magnetic material containing at least Ni in a group consisting of Ni, Co, Fe, Ta, Cr, Rh, Mo and Nb. Specifically, it is preferable that the second soft magnetic layer 26 is made of $[Ni_xCo_yFe_{100-(x+y)}]_{100-z}M_{II_z}$, where $M_{II}$ represents at least one of Ta, Cr, Rh, Mo and Nb, and x, y and z are within a range of $75 \leq x \leq 90$, $0 \leq y \leq 15$ and $0 \leq z \leq 15$ in units of atom %, respectively.

Both the first soft magnetic layer 25 and the second soft magnetic layer 26 form a soft magnetic layer, which is sometimes called a free layer. The soft magnetic layer corresponds to a specific example of "a soft magnetic layer" of the invention. The orientation of a magnetic field of the soft magnetic layer changes according to a signal magnetic field from the magnetic recording medium 300. Preferably, the thickness of the soft magnetic layer, i.e., the thickness of the first soft magnetic layer 25 plus the thickness of the second soft magnetic layer 26 is, for example, from 1 nm to 6 nm inclusive, or more preferably the thickness of the soft magnetic layer is equal to or less than 3 nm. Too thin a soft magnetic layer causes deterioration in properties, such as asymmetry of output of the thin film magnetic head 100 and noise. Too thick a soft magnetic layer causes reduction in the rate of resistance change and the magnitude of resistance change.

For example, the second nonmagnetic layer 27 contains at least one element in a group consisting of Au, Ag, Cu, Ru, Rh, Re, Pt and W, and the percentage of content of the at least one element is 80 wt % or more. Preferably, the thickness of the second nonmagnetic layer 27 is from 0.5 nm to 2 nm inclusive, or more preferably the thickness thereof is equal to or less than 1.5 nm.

The high-resistance layer 28 is provided adjacent to the second nonmagnetic layer 27 and is made of a material having resistivity of 200 $\mu\Omega$·cm or more. Thus, the high-resistance layer 28 reflects at least some of electrons moving through the stack 20, thereby enabling increasing the rate of resistance change and the magnitude of resistance change of the stack 20. Specifically, it is preferable that the high-resistance layer 28 contains at least one element in a group of metal elements consisting of Al, Cr, Ti, Ru, Mn, Rh, Ag, Pd, Ni, Cu, Co, Fe, Re and Ta, and at least one element in a group consisting of O and N. Thus, the high-resistance layer 28 has high electrical resistance and is thermally stable. Preferably, an element having higher ionization energy is used as a metal element which the high-resistance layer 28 is to be made of. Thus, the high-resistance layer 28 can obtain higher thermal stability. Preferably, the high-resistance layer 28 contains at least one element in a group consisting of, in particular, Al, Cr, Ti, Ru, Mn and Rh, because the more preceding metal elements in the above-mentioned group of metal elements have higher ionization energy. Preferably, the thickness of the high-resistance layer 28 is from 0.5 nm to 30 nm inclusive. When the thickness of the high-resistance layer 28 is within the above-mentioned range, moving electrons have the highest reflection efficiency. The above-mentioned resistivity of the high-resistance layer 28 has a value obtained at ordinary temperature (20 degrees).

The underlayer 21, the antiferromagnetic layer 22, the ferromagnetic layer 23, the first nonmagnetic layer 24, the first soft magnetic layer 25, the second soft magnetic layer 26, the second nonmagnetic layer 27 and the high-resistance layer 28 are stacked in this order on the first gap layer 13. It is preferable to locate the high-resistance layer 28 at the top of these layers because surface roughness of the high-resistance layer 28 is considerably great and the roughness adversely affect the layers formed above the high-resistance layer 28.

Magnetic domain control films 30a and 30b are provided on both sides of the stack 20, i.e., both sides along the direction perpendicular to the direction of stack, thereby matching the orientations of magnetizations of the first soft magnetic layer 25 and the second soft magnetic layer 26 to each other, thus forming a single magnetic domain and thus preventing so-called Barkhausen noise. The magnetic domain control film 30a has a stacked structure comprising a magnetic domain controlling ferromagnetic film 31a and a magnetic domain controlling antiferromagnetic film 32a, which are stacked in this order on the first gap layer 13. The magnetic domain control film 30b has the same structure as the magnetic domain control film 30a has. The orientations of magnetizations of the magnetic domain controlling ferromagnetic films 31a and 31b are fixed by exchange coupling on interfaces between the magnetic domain controlling ferromagnetic films 31a and 31b and the magnetic domain controlling antiferromagnetic films 32a and 32b. Thus, for example, as shown in FIG. 7, a bias magnetic field Hb to the first soft magnetic layer 25 and the second soft magnetic layer 26 is generated in the x-direction near the magnetic domain controlling ferromagnetic films 31a and 31b.

For example, the magnetic domain controlling ferromagnetic films 31a and 31b are each 10 nm to 50 nm in thickness. For example, the magnetic domain controlling ferromagnetic films 31a and 31b are made of NiFe, a magnetic material made of Ni, Fe and Co, or the like. In this case, the magnetic domain controlling ferromagnetic films 31a and 31b may be formed of a stacked film of NiFe and Co. For example, the magnetic domain controlling antiferromagnetic films 32a and 32b are each 5 nm to 30 nm in thickness and are made of an antiferromagnetic material. Although the antiferromagnetic material may be either the non-heat-treatment type antiferromagnetic material or the heat-treatment type antiferromagnetic material, the non-heat-treatment type antiferromagnetic material is preferable. The magnetic domain control films 30a and 30b may be made of a hard magnetic material such as CoPt or CoPtCr.

Lead layers 33a and 33b, which are formed of a stacked film of Ta and Au, a stacked film of TiW and Ta, a stacked film of TiN (titanium nitride) and Ta, or the like, are provided on the magnetic domain control films 30a and 30b, respectively, so that a current can be passed through the stack 20 through the magnetic domain control films 30a and 30b.

For example, as shown in FIGS. 3 and 5, the recording head 102 has a write gap layer 41 of 0.1 $\mu$m to 0.5 $\mu$m thick formed of an insulating film such as $Al_2O_3$ on the second magnetic layer 15. The write gap layer 41 has an opening 41a at a position corresponding to the center of thin film coils 43 and 45 to be described later. The thin film coil 43 of 1 $\mu$m to 3 $\mu$m thick and a photoresist layer 44 for coating the thin film coil 43 are formed on the write gap layer 41 with a photoresist layer 42 in between, and the photoresist layer 42 has a thickness of 1.0 $\mu$m to 5.0 $\mu$m for determining a throat height. The thin film coil 45 of 1 $\mu$m to 3 $\mu$m thick and a photoresist layer 46 for coating the thin film coil 45 are formed on the photoresist layer 44. In the embodiment, the description is given with regard to an example in which two thin film coil layers are stacked. However, the number of thin film coil layers may be one, or three or more.

A top pole 47 of about 3 $\mu$m thick made of a magnetic material having high saturation magnetic flux density, such as NiFe or FeN (iron nitride), is formed on the write gap layer 41 and the photoresist layers 42, 44 and 46. The top pole 47 is in contact with and magnetically coupled to the second magnetic layer 15 through the opening 41a of the write gap layer 41 located at the position corresponding to the center of the thin film coils 43 and 45. Although not shown in FIGS. 3 to 6, an overcoat layer (an overcoat layer 48 shown in FIG. 13B) of 20 $\mu$m to 30 $\mu$m thick made of, for example, $Al_2O_3$ is formed on the top pole 47 so as to coat the overall surface. Thus, the recording head 102 generates a magnetic flux between the bottom pole, i.e., the second magnetic layer 15 and the top pole 47 by a current passing through the thin film coils 43 and 45, and thus magnetizes the magnetic recording medium 300 by the magnetic flux generated near the write gap layer 41, thereby recording information on the magnetic recording medium 300.

<Operation of MR Element and Thin Film Magnetic Head>

Next, a reproducing operation of the MR element 110 and the thin film magnetic head 100 configured as described above will be described with main reference to FIGS. 6 and 7.

In the thin film magnetic head 100, the reproducing head 101 reads out information recorded on the magnetic recording medium 300. In the reproducing head 101, for example, the orientation of magnetization Mp of the ferromagnetic layer 23 is fixed in the y-direction by the exchange coupling magnetic field generated by exchange coupling on the interface between the ferromagnetic layer 23 and the antiferromagnetic layer 22 of the stack 20. Magnetizations Mf of the first soft magnetic layer 25 and the second soft magnetic layer 26 are oriented in the direction of the bias magnetic field Hb (the x-direction) by the bias magnetic field Hb generated by the magnetic domain control films 30a and 30b. The orientation of the bias magnetic field Hb is substantially perpendicular to the orientation of the magnetization Mp of the ferromagnetic layer 23.

For reading out information, a sense current that is a stationary electric current is passed through the stack 20 in, for example, the direction of the bias magnetic field Hb through the lead layers 33a and 33b. At this time, the orientations of the magnetizations Mf of the first soft magnetic layer 25 and the second soft magnetic layer 26 change under the signal magnetic field from the magnetic recording medium 300. The orientation of the magnetization Mp of the ferromagnetic layer 23 does not change even under the signal magnetic field from the magnetic recording medium 300, because the orientation thereof is fixed by the antiferromagnetic layer 22. When the orientations of the magnetizations Mf of the first soft magnetic layer 25 and the second soft magnetic layer 26 change, the current passing through the stack 20 is subjected to resistance according to a relative angle between the orientations of the magnetizations Mf of the first soft magnetic layer 25 and the second soft magnetic layer 26 and the orientation of the magnetization Mp of the ferromagnetic layer 23. This is caused by a phenomenon, which is called "spin-dependent scattering", that is, the degree of scattering of electrons on the interface between the nonmagnetic layer and the magnetic layer depends on the direction of magnetization of the magnetic layer. The amount of change in the resistance of the stack 20 is detected as the amount of change in voltage, and thus information recorded on the magnetic recording medium 300 is read out.

In the embodiment, the second nonmagnetic layer 27 is provided on the side of the second soft magnetic layer 26 opposite to the first nonmagnetic layer 24, and the high-resistance layer 28 is provided adjacent to the second nonmagnetic layer 27. Therefore, stable properties are obtained, and also the rate of resistance change and the magnitude of resistance change are improved.

<Method of Manufacturing MR Element and Thin Film Magnetic Head>

Next, a method of manufacturing the MR element 110 and the thin film magnetic head 100 will be described with reference to FIG. 8 to FIGS. 13A and 13B. FIG. 8, FIGS. 12A and 12B and FIGS. 13A and 13B show a sectional structure taken along the line V—V of FIG. 4. FIGS. 9A to 9C to FIGS. 11A and 11B show a sectional structure taken along the line VI—VI of FIG. 4.

Figure 8:
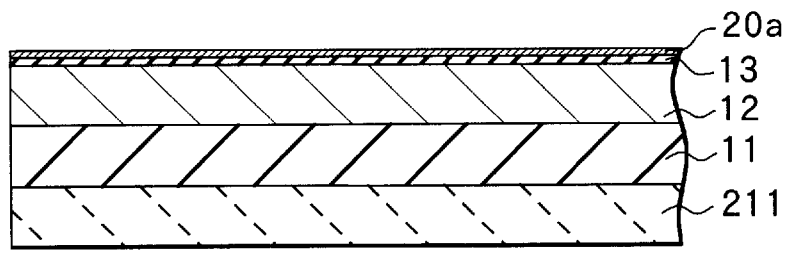
FIG. 8 is a sectional view for describing a step of a method of manufacturing the thin film magnetic head shown in FIG. 3.

In the manufacturing method according to the embodiment, first, as shown in FIG. 8, for example, the insulating layer 11 is formed on one side of the base 211 made of $Al_2O_3$—TiC by sputtering using the material mentioned in the description of the structure. Then, the first magnetic layer 12 is formed on the insulating layer 11 by, for example, plating using the material mentioned in the description of the structure. Subsequently, the first gap layer 13 is formed on the first magnetic layer 12 by, for example, sputtering using the material mentioned in the description of the structure. After that, the stack 20 is formed on the first gap layer 13.

Figure 9A:
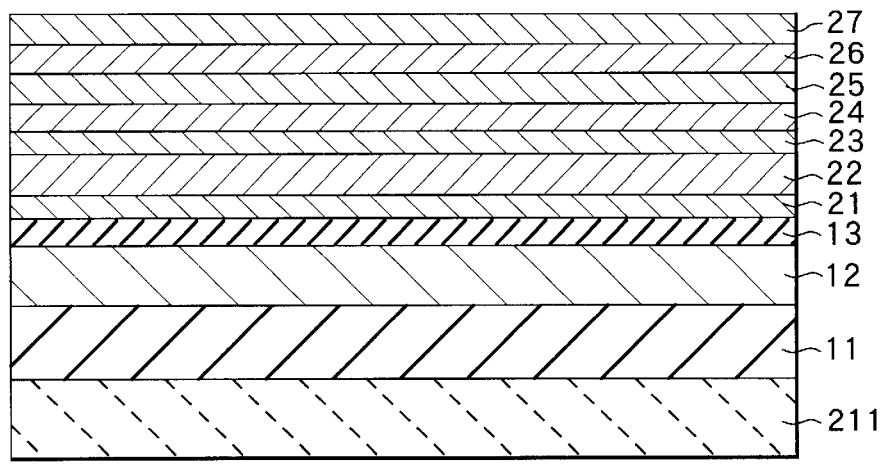
FIGS. 9A to 9C are sectional views for describing a step following the step of FIG. 8.

A step of forming the stack 20 will be now described in detail. First, as shown in FIG. 9A, the underlayer 21, the antiferromagnetic layer 22, the ferromagnetic layer 23, the first nonmagnetic layer 24, the first soft magnetic layer 25, the second soft magnetic layer 26 and the second nonmagnetic layer 27 are formed in sequence on the first gap layer 13 by, for example, sputtering using the materials mentioned in the description of the structure. To form the antiferromagnetic layer 22 by the non-heat-treatment type antiferromagnetic material, the antiferromagnetic layer 22 is formed with a magnetic field applied in the y-direction (see FIG. 7), for example. Thus, the orientation of magnetization of the ferromagnetic layer 23 is fixed in the direction y of the applied magnetic field by exchange coupling between the ferromagnetic layer 23 and the antiferromagnetic layer 22. This process of forming a film takes place in a vacuum chamber (not shown).

Figure 9B:
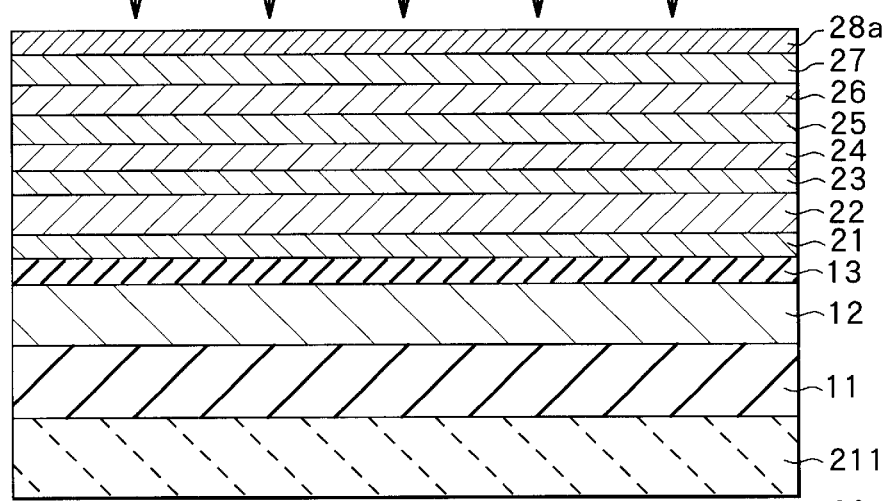
Figure 9C:
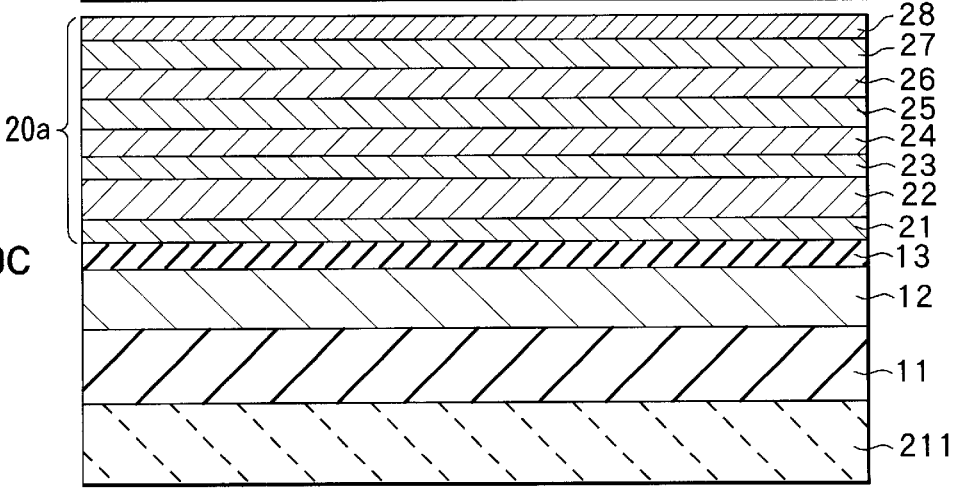

Subsequently, as shown in FIG. 9B, a metal layer 28a containing at least one element in a group consisting of Al, Cr, Ti, Ru, Mn, Rh, Ag, Pd, Ni, Cu, Co, Fe, Re and Ta is formed on the second nonmagnetic layer 27 by sputtering, for example. Then, at least one of oxygen gas and nitrogen gas is introduced into a vacuum chamber (not shown), and the metal layer 28a is exposed to this atmosphere for a predetermined time. Thus, the high-resistance layer 28 having the structure mentioned in the description of the structure is formed. Thus, a stacked film 20a is formed as shown in FIG. 9C.

Figure 10A:
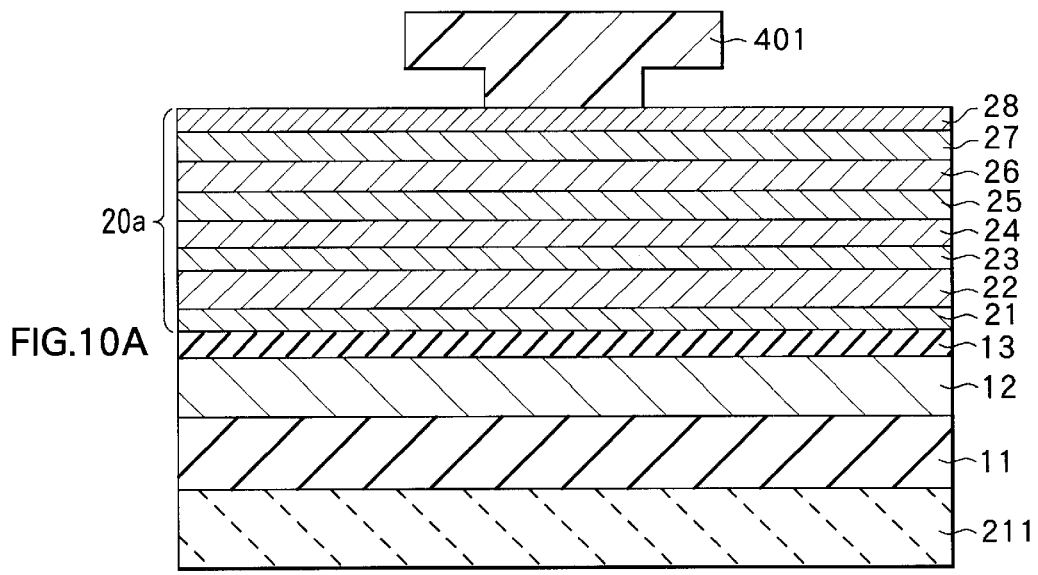
FIGS. 10A and 10B are sectional views for describing a step following the step of FIGS. 9A to 9C.
Figure 10B:
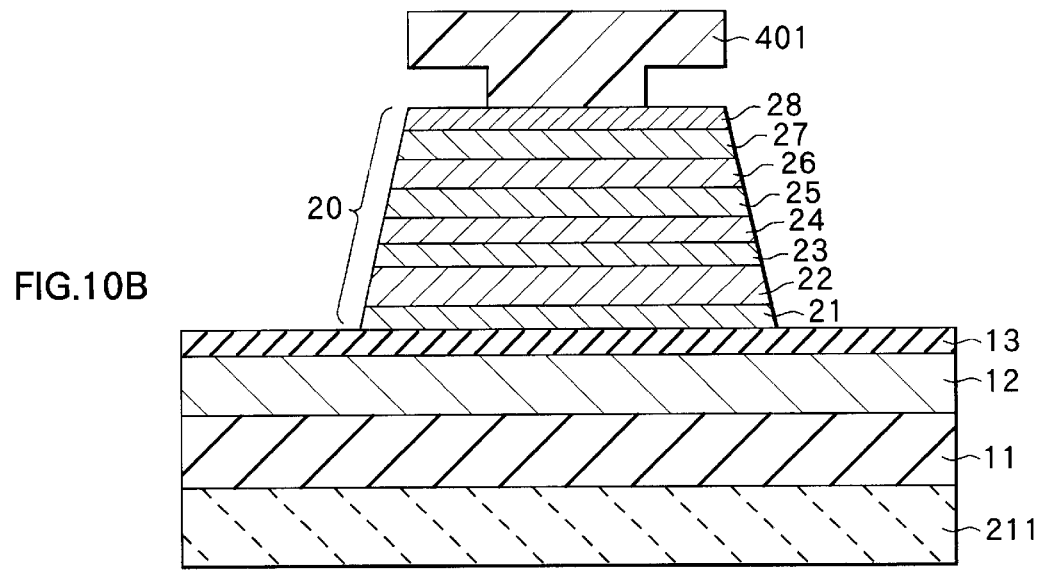

After that, as shown in FIG. 10A, a photoresist film 401 is selectively formed on the stacked film 20a in a region in which the stack 20 is to be formed. Preferably, the photoresist film 401 is, for example, T-shaped in cross section by forming a trench in an interface between the photoresist film 401 and the stacked film 20a, so as to facilitate lift-off procedures to be described later. After forming the photoresist film 401, the stacked film 20a is etched by, for example, ion milling using the photoresist film 401 as a mask. Thus, the stack 20 is formed as shown in FIG. 10B.

Figure 11A:
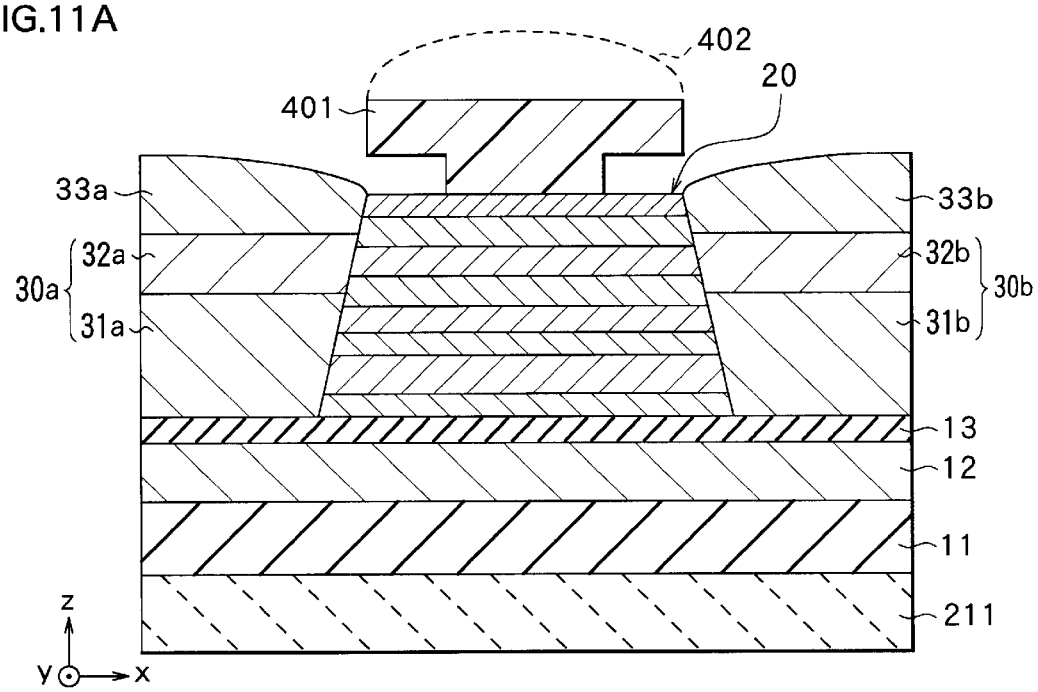
FIGS. 11A and 11B are sectional views for describing a step following the step of FIGS. 10A and 10B.

After forming the stack 20, as shown in FIG. 11A, the magnetic domain controlling ferromagnetic films 31a and 31b and the magnetic domain controlling antiferromagnetic films 32a and 32b are formed in sequence on both sides of the stack 20 by sputtering, for example. To form the magnetic domain controlling antiferromagnetic films 32a and 32b by the non-heat-treatment type antiferromagnetic material, the magnetic domain controlling antiferromagnetic films 32a and 32b are formed with a magnetic field applied in the x-direction, for example. Thus, the orientations of magnetizations of the magnetic domain controlling ferromagnetic films 31a and 31b are fixed in the direction x of the applied magnetic field by exchange coupling between the magnetic domain controlling ferromagnetic films 31a and 31b and the magnetic domain controlling antiferromagnetic films 32a and 32b.

After forming the magnetic domain control films 30a and 30b, as shown in FIG. 11A, the lead layers 33a and 33b are formed on the magnetic domain controlling antiferromagnetic films 32a and 32b, respectively, by sputtering, for example. After that, the photoresist film 401 and a deposit 402 stacked thereon (the materials of the magnetic domain controlling ferromagnetic film, the magnetic domain controlling antiferromagnetic film and the lead layer) are removed by lift-off procedures, for example.

Figure 11B:
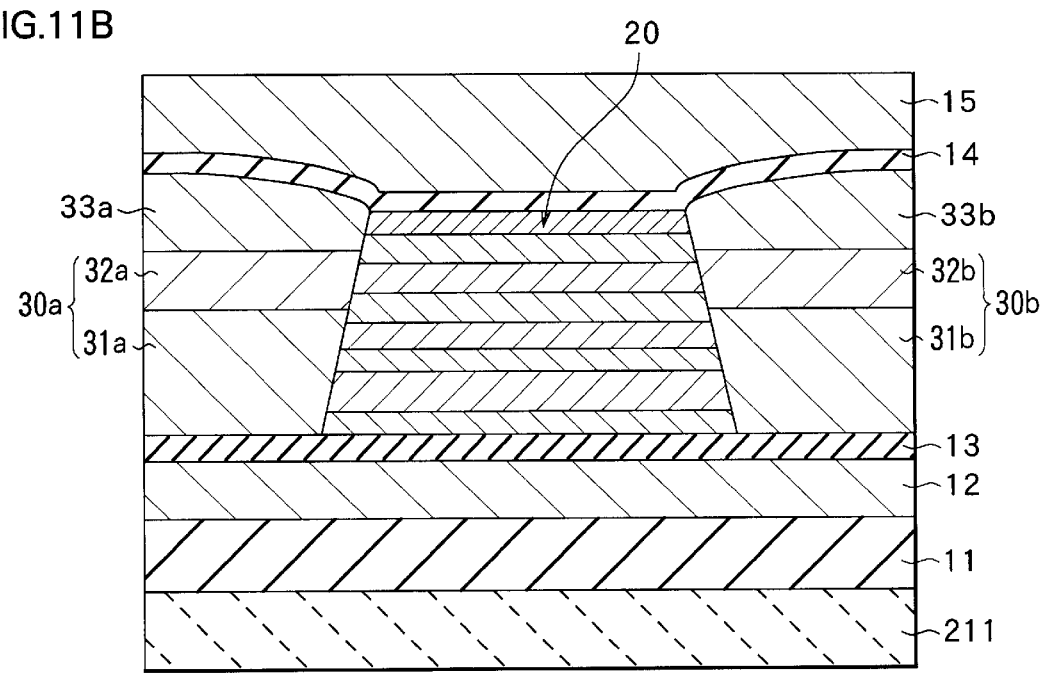
Figure 12A:
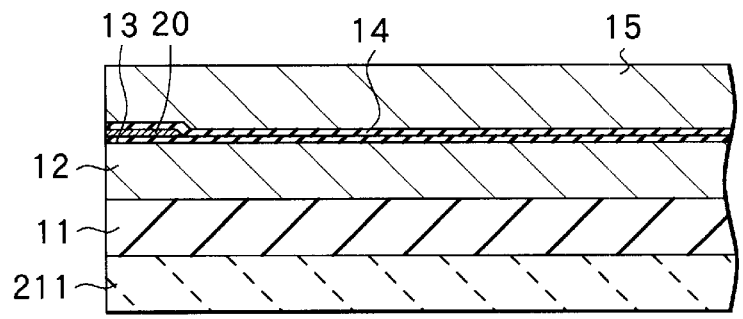
FIGS. 12A and 12B are sectional views for describing a step following the step of FIGS. 11A and 11B.

After lift-off procedures, as shown in FIGS. 11B and 12A, the second gap layer 14 is formed by, for example, sputtering using the material mentioned in the description of the structure, so as to coat the first gap layer 13 and the stack 20. Thus, the stack 20 is sandwiched in between the first gap layer 13 and the second gap layer 14. After that, the second magnetic layer 15 is formed on the second gap layer 14 by, for example, sputtering using the material mentioned in the description of the structure.

Figure 12B:
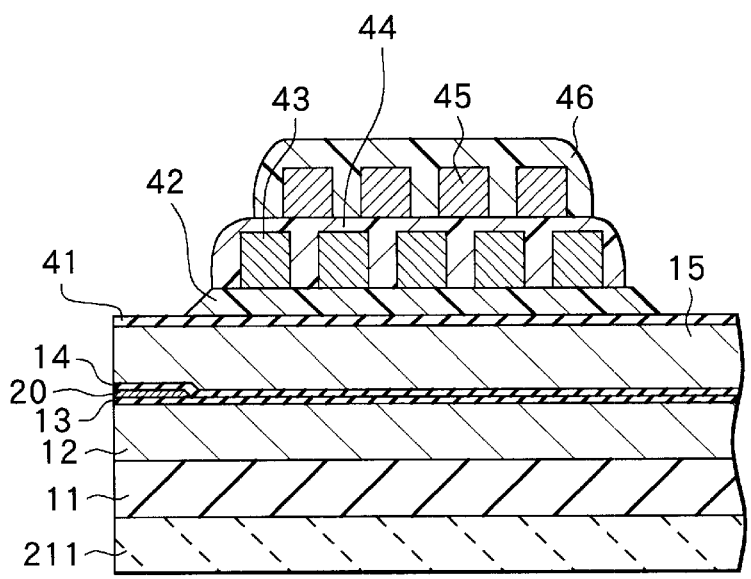

After forming the second magnetic layer 15, as shown in FIG. 12B, the write gap layer 41 is formed on the second magnetic layer 15 by, for example, sputtering using the material mentioned in the description of the structure. The photoresist layer 42 is formed into a predetermined pattern on the write gap layer 41. After forming the photoresist layer 42, the thin film coil 43 is formed on the photoresist layer 42 by using the material mentioned in the description of the structure. The photoresist layer 44 is formed into a predetermined pattern so as to coat the thin film coil 43. After forming the photoresist layer 44, the thin film coil 45 is formed on the photoresist layer 44 by using the material mentioned in the description of the structure. The photoresist layer 46 is formed into a predetermined pattern so as to coat the thin film coil 45.

Figure 13A:
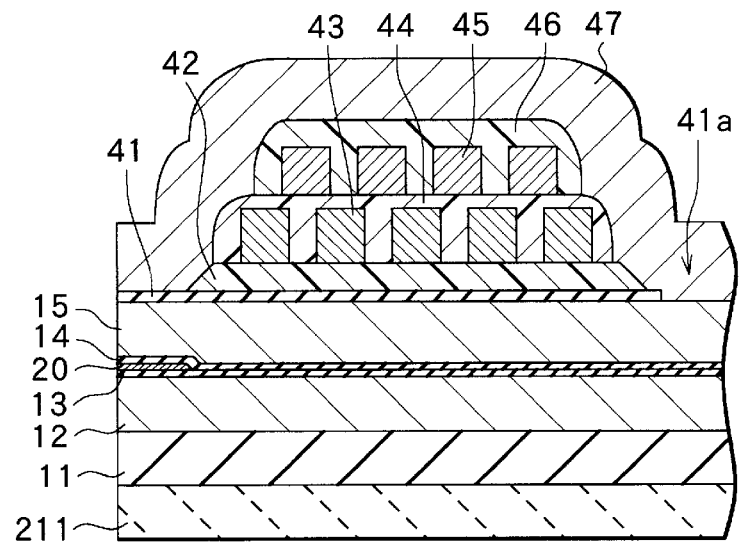
FIGS. 13A and 13B are sectional views for describing a step following the step of FIGS. 12A and 12B.
Figure 13B:
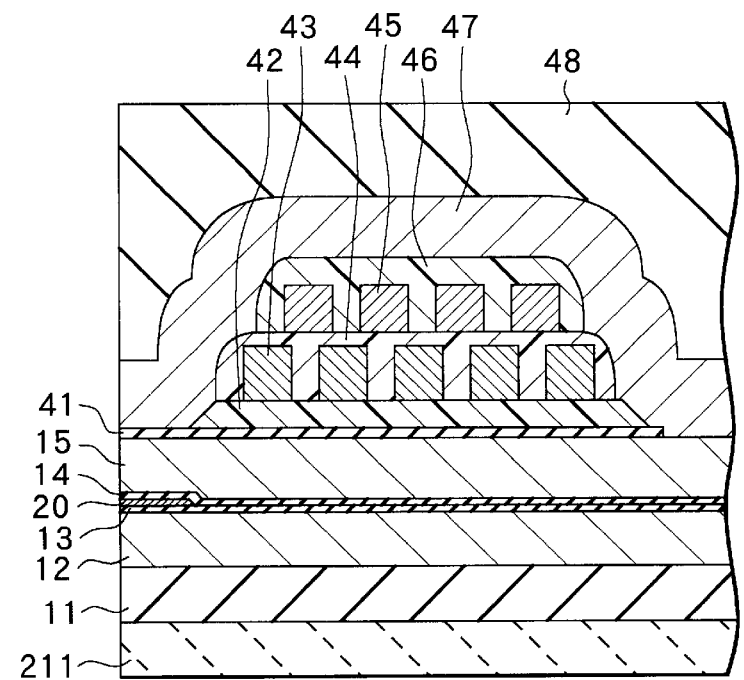

After forming the photoresist layer 46, as shown in FIG. 13A, for example, the write gap layer 41 is partly etched at the position corresponding to the center of the thin film coils 43 and 45, and thus the opening 41a for forming a magnetic path is formed. After that, for example, the top pole 47 is formed on the write gap layer 41, the opening 41a and the photoresist layers 42, 44 and 46 by using the material mentioned in the description of the structure. After forming the top pole 47, for example, the write gap layer 41 and the second magnetic layer 15 are selectively etched by ion milling using the top pole 47 as a mask. After that, as shown in FIG. 13B, the overcoat layer 48 is formed on the top pole 47 by using the material mentioned in the description of the structure.

After forming the overcoat layer 48, for example, to form the ferromagnetic layer 23 of the stack 20 and the magnetic domain controlling ferromagnetic films 31a and 31b by the heat-treatment type antiferromagnetic material, a process of antiferromagnetizing for fixing the orientations of magnetic fields of the layer 23 and the films 31a and 31b takes place. Specifically, when a blocking temperature of the antiferromagnetic layer 22 and the ferromagnetic layer 23 (a temperature at which exchange coupling can occur on an interface) is higher than the blocking temperature of the magnetic domain controlling antiferromagnetic films 32a and 32b and the magnetic domain controlling ferromagnetic films 31a and 31b, the thin film magnetic head 100 is heated at the blocking temperature of the antiferromagnetic layer 22 and the ferromagnetic layer 23 with a magnetic field applied in, for example, the y-direction by utilizing a magnetic field generating apparatus or the like. Thus, the orientation of magnetization of the ferromagnetic layer 23 is fixed in the direction y of the applied magnetic field by exchange coupling between the ferromagnetic layer 23 and the antiferromagnetic layer 22. Subsequently, the thin film magnetic head 100 is cooled to the blocking temperature of the magnetic domain controlling antiferromagnetic films 32a and 32b and the magnetic domain controlling ferromagnetic films 31a and 31b, and thus a magnetic field is applied in the x-direction, for example. Thus, the orientations of magnetizations of the magnetic domain controlling ferromagnetic films 31a and 31b are fixed in the direction x of the applied magnetic field by exchange coupling between the magnetic domain controlling ferromagnetic films 31a and 31b and the magnetic domain controlling antiferromagnetic films 32a and 32b.

When the blocking temperature of the antiferromagnetic layer 22 and the ferromagnetic layer 23 is lower than the blocking temperature of the magnetic domain controlling antiferromagnetic films 32a and 32b and the magnetic domain controlling ferromagnetic films 31a and 31b, the process is the reverse of the above-mentioned procedure. Heat treatment is not necessary to form the antiferromagnetic layer 22 or the magnetic domain controlling antiferromagnetic films 32a and 32b by the non-heat-treatment type antiferromagnetic material. In the embodiment, heat treatment for antiferromagnetizing takes place after forming the overcoat layer 48. After forming the ferromagnetic layer 23 and the antiferromagnetic layer 22, heat treatment may, however, take place before forming the overcoat layer 48. After forming the magnetic domain control films 30a and 30b, heat treatment may take place before forming the overcoat layer 48.

Finally, the air bearing surface is formed by, for example, machining the slider. As a result, the thin film magnetic head 100 shown in FIGS. 3 to 7 is completed.

<Effects of First Embodiment>

As described above, according to the embodiment, the second nonmagnetic layer 27 is provided on the side of the second soft magnetic layer 26 opposite to the first nonmagnetic layer 24, and the high-resistance layer 28 is provided adjacent to the second nonmagnetic layer 27. Therefore, stable properties can be obtained, and also the rate of resistance change and the magnitude of resistance change can be increased. Accordingly, adaptation to recording at high density in excess of, for example, 20 Gbit/inch$^2$ can be made.

In particular, when the high-resistance layer 28 contains at least one element in a group consisting of Al, Cr, Ti, Ru, Mn, Rh, Ag, Pd, Ni, Cu, Co, Fe, Re and Ta and at least one element in a group consisting of O and N, high thermal stability can be obtained. In more particular, when the high-resistance layer 28 contains at least one element in a group consisting of Al, Cr, Ti, Ru, Mn and Rh, thermal stability can be further improved.

Additionally, when the thickness of the high-resistance layer 28 is from 1 nm to 30 nm inclusive, the rate of resistance change and the magnitude of resistance change are further increased.

Moreover, the second nonmagnetic layer 27 contains at least one element in a group consisting of Au, Ag, Cu, Ru, Rh, Re, Pt and W, the percentage of content of the at least one element is 80 wt % or more, and the thickness of the second nonmagnetic layer 27 is from 0.5 nm to 2 nm inclusive. Thus, even if the thickness of the soft magnetic layer (the first soft magnetic layer 25 and the second soft magnetic layer 26) is reduced, deterioration in properties, such as asymmetry of output, can be prevented and therefore stable properties can be obtained.

[Modification of First Embodiment]

A modification of the first embodiment will be described with reference to FIG. 14.

Figure 14:
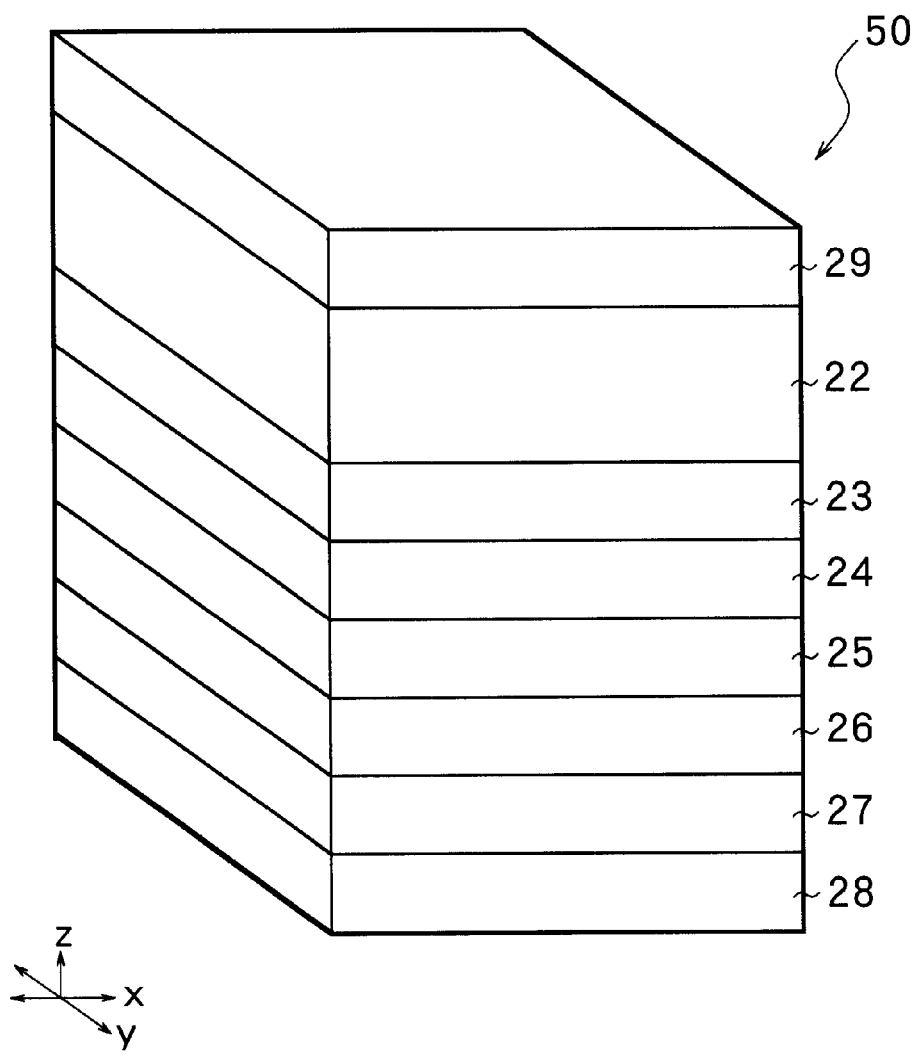
FIG. 14 is a perspective view of a structure of a stack of a magnetic transducer according to a modification of the first embodiment.

FIG. 14 shows the structure of the stack 20 of the modification. In the first embodiment, the description is given with regard to an example in which the stack 20 has a stacked structure comprising the antiferromagnetic layer 22, the ferromagnetic layer 23, the first nonmagnetic layer 24, the first soft magnetic layer 25, the second soft magnetic layer 26, the second nonmagnetic layer 27 and the high-resistance layer 28, which are stacked in this order on the first gap layer 13. However, the stack 20 may have a stacked structure comprising the high-resistance layer 28, the second nonmagnetic layer 27, the second soft magnetic layer 26, the first soft magnetic layer 25, the first nonmagnetic layer 24, the ferromagnetic layer 23 and the antiferromagnetic layer 22, which are stacked in this order on the first gap layer 13. In this case, the underlayer 21 of the first embodiment is unnecessary. Preferably, a cap layer 29 of, for example, 5 nm thick made of Ta is provided on the antiferromagnetic layer 22. Furthermore, in this case, the first gap layer 13, which is provided adjacent to the second nonmagnetic layer 27 and is made of a material having resistivity of 200 $\mu\Omega$·cm or more, may also function as a high-resistance layer.

[Second Embodiment]

A second embodiment of the invention will be described with reference to FIG. 15. The second embodiment has the same structure as the first embodiment, except that the structures of a stack 50 and a second gap layer 514 of a reproducing head 501 differ from the structures of the stack 20 and the second gap layer 14 of the reproducing head 101. Accordingly, in the second embodiment, the same structural elements are indicated by the same reference numerals, and the detailed description thereof is omitted.

Figure 15:
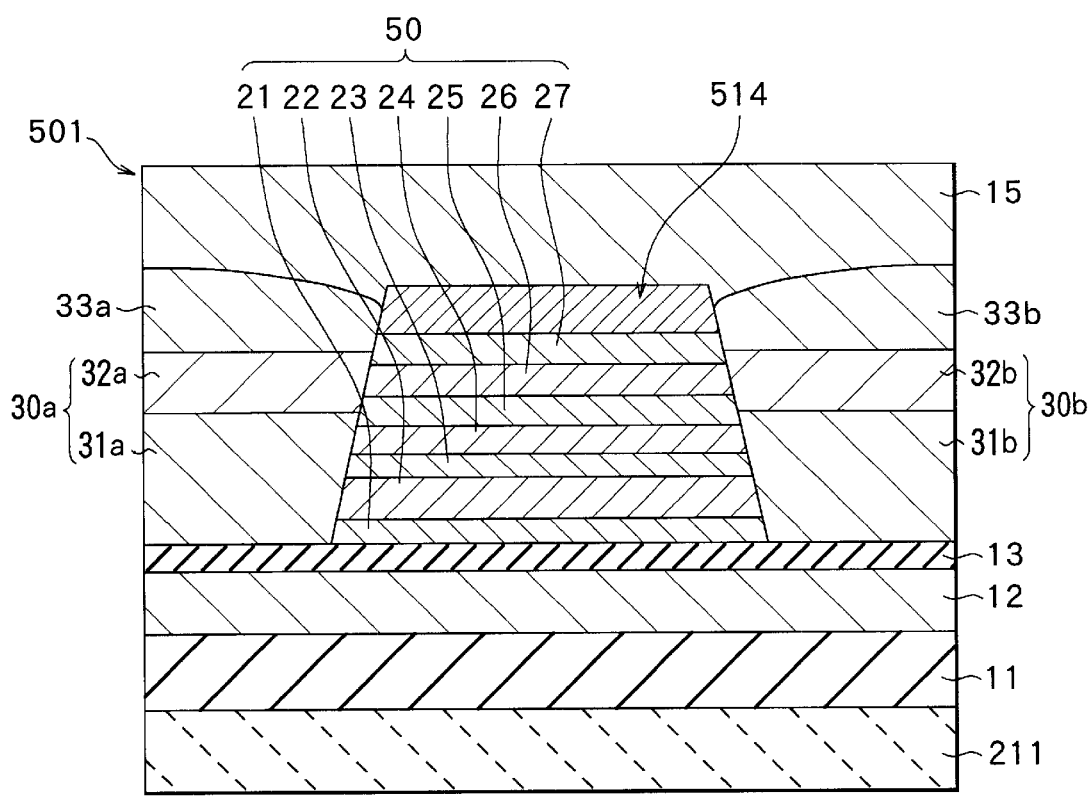
FIG. 15 is a sectional view of a structure of a stack of a reproducing head of a magnetic transducer according to a second embodiment.

FIG. 15 shows a sectional structure of a thin film magnetic head of the second embodiment and shows a sectional structure viewed from the direction of the arrows along the line VI—VI of FIG. 4. The stack 50 of the reproducing head 501 has the same structure as the stack 20 of the first embodiment, except that the stack 50 does not comprise the high-resistance layer 28. The second gap layer 514 of the reproducing head 501 is provided adjacent to the second nonmagnetic layer 27 of the stack 50, and is provided between the second nonmagnetic layer 27 and the second magnetic layer 15 so as to correspond to the stack 50. The second gap layer 514 functions as both the second gap layer 14 (see FIG. 11B) and the high-resistance layer 28 of the first embodiment. In other words, the second gap layer 514 is made of a material having resistivity of 200 $\mu\Omega$·cm or more, similarly to the high-resistance layer 28 of the first embodiment. Specifically, it is preferable that the second gap layer 514 contains at least one element in a group of metal elements consisting of Al, Cr, Ti, Ru, Mn, Rh, Ag, Pd, Ni, Cu, Co, Fe, Re and Ta, and at least one element in a group consisting of O and N. It is more preferable that the second gap layer 514 contains at least one element in a group consisting of Al, Cr, Ti, Ru, Mn and Rh.

The reproducing head 501 having the above-described structure can be manufactured in the following manner, for example.

First, the insulating layer 11, the first magnetic layer 12 and the first gap layer 13 are formed in sequence on one side of the base 211 in the same manner as the first embodiment. The underlayer 21, the antiferromagnetic layer 22, the ferromagnetic layer 23, the first nonmagnetic layer 24, the first soft magnetic layer 25, the second soft magnetic layer 26 and the second nonmagnetic layer 27 are formed in sequence on the first gap layer 13. Then, the second gap layer 514 is formed on the second nonmagnetic layer 27 by sputtering, for example. After that, the layers from the second gap layer 514 to the underlayer 21 are selectively removed to be patterned in the same manner as the first embodiment. Subsequently, the magnetic domain controlling ferromagnetic films 31a and 31b, the magnetic domain controlling antiferromagnetic films 32a and 32b, the lead layers 33a and 33b and the second magnetic layer 15 are formed in sequence in the same manner as the first embodiment. Thus, the reproducing head 501 shown in FIG. 15 is formed.

As described above, according to the second embodiment, the second gap layer 514 is provided adjacent to the second nonmagnetic layer 27, and the second gap layer 514 is made of a material having resistivity of 200 $\mu\Omega$·cm or more. Therefore, the same effects as the effects of the first embodiment can be achieved.

In the second embodiment, similarly to the modification of the first embodiment, the stack 50 may have a stacked structure comprising the second nonmagnetic layer 27, the second soft magnetic layer 26, the first soft magnetic layer 25, the first nonmagnetic layer 24, the ferromagnetic layer 23 and the antiferromagnetic layer 22, which are stacked in this order on the first gap layer 13. In this case, the second nonmagnetic layer 27 is provided adjacent to the first gap layer 13, and the first gap layer 13 is made of a material having resistivity of 200 $\mu\Omega$·cm or more. Thus, the first gap layer 13 is adapted to also function as a high-resistance layer.

[Third Embodiment]

A third embodiment of the invention will be described with reference to FIG. 16. The third embodiment has the same structure as the first embodiment, except that the structure of a ferromagnetic layer 63 of a stack 60 differs from the structure of the ferromagnetic layer 23 of the stack 20. Accordingly, in the third embodiment, the same structural elements are indicated by the same reference numerals, and the detailed description thereof is omitted.

Figure 16:
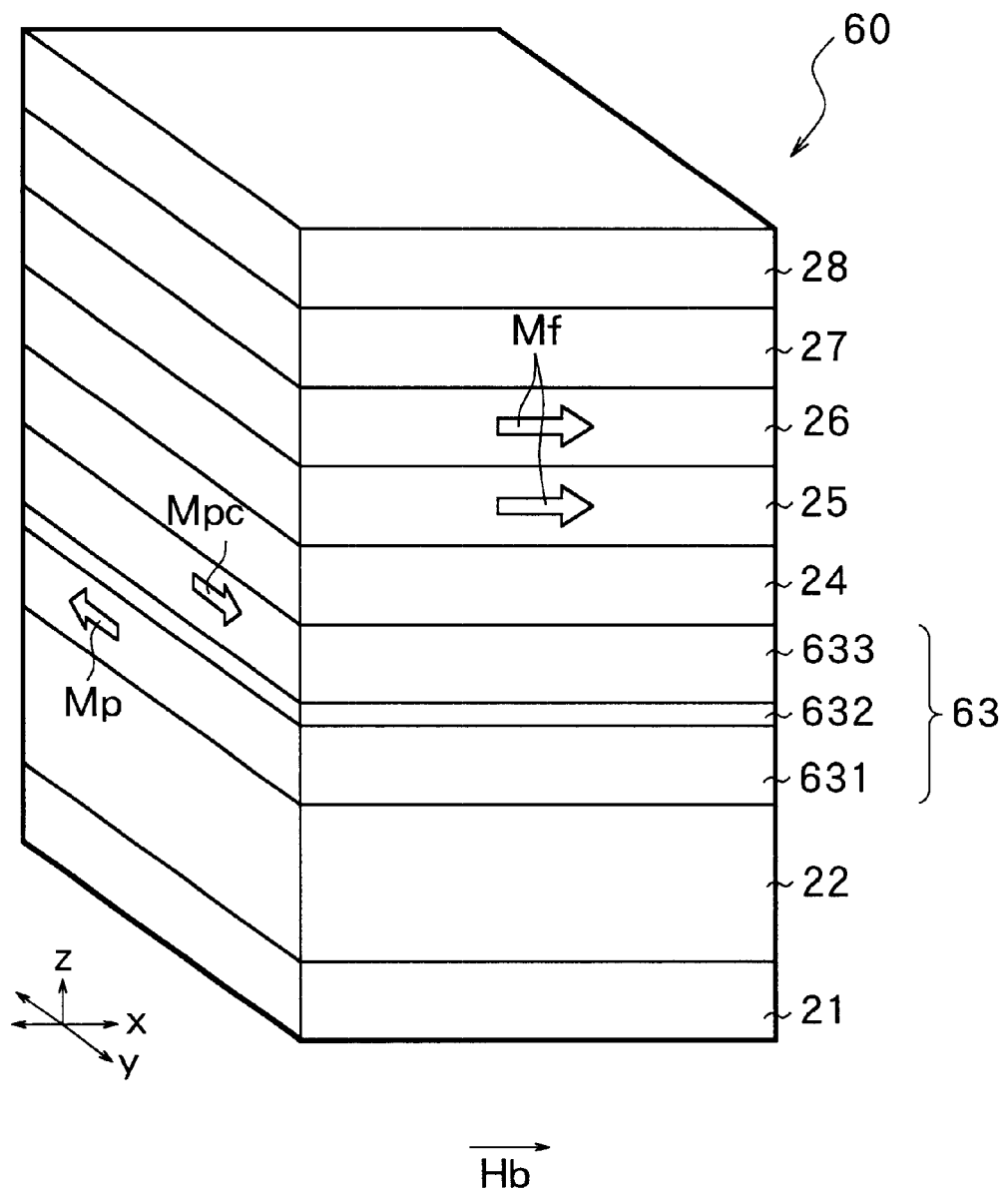
FIG. 16 is a perspective view of a structure of a stack of a magnetic transducer according to a third embodiment.

FIG. 16 shows the structure of the stack 60 of the third embodiment. The ferromagnetic layer 63 of the stack 60 has a stacked structure comprising an ferromagnetic outer layer 631, a coupling layer 632 and an ferromagnetic inner layer 633, which are stacked in this order on the antiferromagnetic layer 22. The ferromagnetic outer layer 631 and the ferromagnetic inner layer 633 are made of a magnetic material containing at least Co in a group consisting of Co and Fe. Preferably, the (111) plane of the magnetic material is oriented in the direction of stack. The thickness of the ferromagnetic outer layer 631 plus the thickness of the ferromagnetic inner layer 633 is 3 nm to 5 nm, for example.

For example, the coupling layer 632 interposed between the ferromagnetic outer layer 631 and the ferromagnetic inner layer 633 is 0.2 nm to 1.2 nm in thickness and is made of a nonmagnetic material containing at least one element in a group consisting of Ru, Rh, Re, Cr and Zr. The coupling layer 632 is a layer for inducing antiferromagnetic exchange coupling between the ferromagnetic outer layer 631 and the ferromagnetic inner layer 633 and thus orienting magnetization Mp of the ferromagnetic outer layer 631 and magnetization Mpc of the ferromagnetic inner layer 633 in opposite directions. In other words, the ferromagnetic layer 63 has both of two opposite magnetizations. The above-mentioned laminar structure is called a synthetic structure. Incidentally, the phrase "magnetizations are oriented in opposite directions" herein refers to not only that the orientation of one magnetization differs by 180 degrees from the orientation of the other magnetization, but also that the orientations of two magnetizations differ from each other by 180 degrees plus or minus 20 degrees.

In the third embodiment, the orientation of the magnetization Mp of the ferromagnetic outer layer 631 is fixed by exchange coupling on an interface between the ferromagnetic outer layer 631 and the antiferromagnetic layer 22. The orientation of the magnetization Mpc of the ferromagnetic inner layer 633 is fixed in the direction opposite to the orientation of the magnetization Mp of the ferromagnetic outer layer 631.

The stack 60 can be manufactured in substantially the same manner as the first embodiment. In the third embodiment, information recorded on the magnetic recording medium 300 is read out in the same manner as the first embodiment. In the third embodiment, the ferromagnetic layer 63 can have both of two opposite magnetizations. Therefore, an influence of a magnetic field generated by the ferromagnetic layer 63 upon the first soft magnetic layer 25 and the second soft magnetic layer 26 is reduced. As a result, asymmetry of output voltage waveform is improved.

As described above, according to the third embodiment, in addition to the effects described by referring to the first embodiment, asymmetry of output voltage waveform can be improved and thus stability of properties can be improved, because the ferromagnetic layer 63 has the synthetic structure.

In the third embodiment, similarly to the modification of the first embodiment, the stack 60 may have a stacked structure comprising the high-resistance layer 28, the second nonmagnetic layer 27, the second soft magnetic layer 26, the first soft magnetic layer 25, the first nonmagnetic layer 24, the ferromagnetic layer 63, the antiferromagnetic layer 22 and the cap layer 29, which are stacked in this order on the first gap layer 13. Similarly to the second embodiment, the second gap layer 14 or the first gap layer 13, which is provided adjacent to the second nonmagnetic layer 27, may function as a high-resistance layer.

Furthermore, the soft magnetic layer (the first soft magnetic layer 25 and the second soft magnetic layer 26) rather than or as well as the ferromagnetic layer 63 may have the synthetic structure. In this case, a coupling layer may be provided in either the first soft magnetic layer 25 or the second soft magnetic layer 26 (or both the first and second soft magnetic layers 25 and 26), or a coupling layer may be provided on an interface between the first and second soft magnetic layers 25 and 26.

[Fourth Embodiment]

A fourth embodiment of the invention will be described with reference to FIG. 17. The fourth embodiment has the same structure as the third embodiment, except for the structure of a ferromagnetic inner layer 733 of a ferromagnetic layer 73 of a stack 70. Accordingly, in the fourth embodiment, the same structural elements are indicated by the same reference numerals, and the detailed description thereof is omitted.

Figure 17:
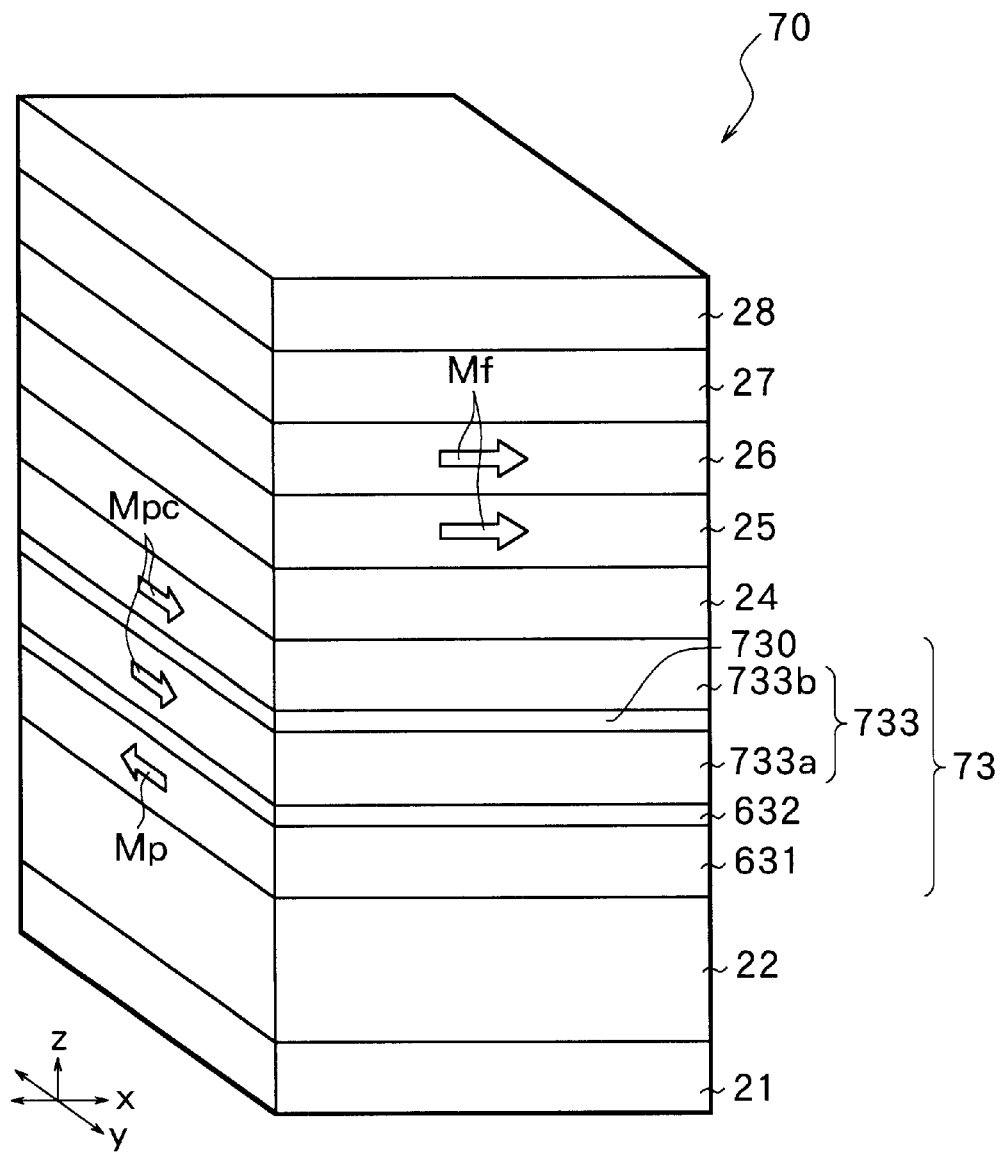
FIG. 17 is a perspective view of a structure of a stack of a magnetic transducer according to a fourth embodiment.

FIG. 17 shows the structure of the stack 70 of the fourth embodiment. In the stack 70, the ferromagnetic inner layer 733 is divided into a first inner layer 733a located close to the coupling layer 632 in the direction of stack and a second inner layer 733b located close to the first nonmagnetic layer 24 in the direction of stack. An interlayer 730, which has magnetism and has higher electrical resistance than electrical resistance of the ferromagnetic inner layer 733, is formed between the first inner layer 733a and the second inner layer 733b. The interlayer 730 is provided for the following purpose. When a sense current passes through the stack 70, the interlayer 730 reflects at least some of electrons and thus limits a path which the electrons are to move through, thereby increasing the rate of resistance change and the magnitude of resistance change of the stack 70.

Since the interlayer 730 has magnetism, magnetizations Mpc of the first inner layer 733a and the second inner layer 733b facing each other with the interlayer 730 in between are fixed in the same direction, e.g., the y-direction. Magnetization of the interlayer 730 is also fixed in the same direction as the magnetizations Mpc of the first inner layer 733a and the second inner layer 733b. Incidentally, the phrase "magnetizations are oriented in the same direction" herein refers to not only that the orientation of one magnetization is completely identical with the orientation of the other magnetization, but also that the angle between two magnetizations fall within a range from about plus 20 degrees to minus 20 degrees.

Preferably, the interlayer 730 contains at least one of, for example, oxide, nitride and nitride oxide. Thus, the interlayer 730 is magnetically stable and can reduce output variations. Preferably, the interlayer 730 has some common elements with the ferromagnetic inner layer 733, for example. Specifically, it is preferable that the interlayer 730 contains at least Ni in a group consisting of Ni, Co, Fe, Ta, Cr, Rh, Mo and Nb, and at least one element in a group consisting of O and N. For example, a good interlayer 730 can be easily formed by oxidizing, nitriding, or oxidizing and nitriding a part of the ferromagnetic inner layer 733. Preferably, the thickness of the interlayer 730 is, for example, from 0.5 nm to 1.0 nm inclusive. Too thick an interlayer 730 weakens magnetic coupling between the first inner layer 733a and the second inner layer 733b and also reduces heat resistance considerably. As a consequence, a high rate of resistance change cannot be obtained. Too thin an interlayer 730 cannot sufficiently limit a path through which electrons are to move. Consequently, a high rate of resistance change cannot be obtained as in the case of too thick an interlayer 730.

The stack 70 can be manufactured in the following manner, for example. First, the underlayer 21, the antiferromagnetic layer 22, the ferromagnetic outer layer 631, the coupling layer 632 and the first inner layer 733a are formed in the same manner as the first embodiment. Then, the interlayer 730 is formed by oxidizing, nitriding, or oxidizing and nitriding a part of the first inner layer 733a. The second inner layer 733b, the first nonmagnetic layer 24, the first soft magnetic layer 25, the second soft magnetic layer 26, the second nonmagnetic layer 27 and the high-resistance layer 28 are formed on the interlayer 730 in the same manner as the first embodiment. Thus, the stack 70 shown in FIG. 17 is formed.

As described above, according to the fourth embodiment, in addition to the effects of the first and third embodiments, the following effect can be achieved because the interlayer 730 is provided in the ferromagnetic layer 73. When a current passes through the stack 70, the interlayer 730 can reflect at least some of electrons and thus limit a path which the electrons are to move through, thereby enabling further increasing the rate of resistance change and the magnitude of resistance change.

In the fourth embodiment, similarly to the modification of the first embodiment, the stack 70 may have a stacked structure comprising the underlayer 21, the high-resistance layer 28, the second nonmagnetic layer 27, the second soft magnetic layer 26, the first soft magnetic layer 25, the first nonmagnetic layer 24, the ferromagnetic layer 73, the antiferromagnetic layer 22 and the cap layer 29, which are stacked in this order on the first gap layer 13. Similarly to the second embodiment, the second gap layer 14 or the first gap layer 13, which is provided adjacent to the second nonmagnetic layer 27, may function as a high-resistance layer.

Furthermore, an interlayer, which has higher resistance than resistance of the first soft magnetic layer 25 and has magnetism, may be provided in the first soft magnetic layer 25. In this case, it is preferable that the interlayer has some common elements with the first soft magnetic layer 25. In this case, it is preferable that the interlayer contains at least one of oxygen and nitrogen. Thus, the interlayer is magnetically stable and can be easily formed by oxidizing, nitriding, or oxidizing and nitriding the first soft magnetic layer 25. The interlayer may be provided in the second soft magnetic layer 26 or between the first soft magnetic layer 25 and the second soft magnetic layer 26.

In addition, the soft magnetic layer (the first soft magnetic layer 25 and the second soft magnetic layer 26) rather than or as well as the ferromagnetic layer 73 may have the synthetic structure. In this case, a coupling layer may be provided in either the first soft magnetic layer 25 or the second soft magnetic layer 26 (or both the first and second soft magnetic layers 25 and 26), or a coupling layer may be provided on an interface between the first and second soft magnetic layers 25 and 26. In the above-mentioned embodiment, the description is given with regard to the case in which the interlayer 730 is provided together with the coupling layer 632. However, only the interlayer 730 may be provided without the coupling layer 632.

EXAMPLES

Specific examples of the invention will be described in detail.

Examples 1-1 to 1-12

The stacks 20 shown in FIG. 7 were prepared as examples 1-1 to 1-12, and the second nonmagnetic layers 27 and the high-resistance layers 28 had varying thicknesses and were made of varying materials as shown in Table 1. First, a Ta film of 3 nm thick and a NiFe film of 2 nm thick were formed in sequence on each insulating substrate made of $Al_2O_3$—TiC on which an $Al_2O_3$ film was formed, and thus the underlayer 21 was formed. Next, the antiferromagnetic layer 22 of 15 nm thick was formed of PtMn on each underlayer 21. The ferromagnetic layer 23 of 2 nm thick was formed of CoFe on each antiferromagnetic layer 22. The first nonmagnetic layer 24 of 2.1 nm thick was formed of Cu on each ferromagnetic layer 23. The first soft magnetic layer 25 of 1 nm thick was formed of CoFe on each first nonmagnetic layer 24. The second soft magnetic layer 26 of 1.5 nm thick was formed of NiFe on each first soft magnetic layer 25. The second nonmagnetic layers 27 having thicknesses shown in Table 1 were formed of materials shown in Table 1 on the second soft magnetic layers 26. The above-mentioned layers were formed by means of sputtering.

Subsequently, metal layers shown in Table 1 were formed on the second nonmagnetic layers 27 by sputtering. The high-resistance layers 28 having thicknesses shown in Table 1 were formed by oxidizing the metal layers. The thicknesses of the high-resistance layers 28 were measured by a transmission electron microscope (TEM). After that, the antiferromagnetic layer 22 was antiferromagnetized by heat treatment because the antiferromagnetic layer 22 was formed of a heat-treatment type antiferromagnetic material (PtMn).

TABLE 1

| | Second nonmagnetic layer | | High-resistance layer | |
|---|---|---|---|---|
| | Material | Thickness (nm) | Contained metal | Thickness (nm) |
| Example | | | | |
| 1-1 | Cu | 1 | Al | 1 |
| 1-2 | Cu | 1.3 | Al | 1 |
| 1-3 | Cu | 1.6 | Al | 1 |
| 1-4 | Cu | 1.3 | Al | 1 |
| 1-5 | Cu | 1.3 | Rh | 1 |
| 1-6 | Cu | 1.3 | Cu | 1.5 |
| 1-7 | Cu | 1.3 | Cr | 1.8 |
| 1-8 | Cu,Au | 1.1 | Cu | 1.8 |
| 1-9 | Rh | 0.6 | Cu | 1.6 |
| 1-10 | Rh | 0.6 | Ru | 1.5 |
| 1-11 | Cu | 2.1 | Al | 1 |
| 1-12 | Cu | 0.4 | Al | 1 |
| Comparison | | | | |
| 1-1 | Cu | 1.3 | — | — |
| 1-2 | Cu | 1.3 | Al (Not oxidized) | 1 |

| | Rate of resistance change (%) | Resistance ($\Omega$) | Magnitude of resistance change ($\Omega$) |
|---|---|---|---|
| Example | | | |
| 1-1 | 15.8 | 18.5 | 2.9 |
| 1-2 | 14.6 | 19.8 | 2.9 |
| 1-3 | 14.2 | 19.0 | 2.7 |
| 1-4 | 14.6 | 19.8 | 2.9 |
| 1-5 | 13.8 | 19.6 | 2.7 |
| 1-6 | 12.4 | 19.4 | 2.4 |
| 1-7 | 14.0 | 18.6 | 2.6 |
| 1-8 | 12.7 | 19.7 | 2.5 |
| 1-9 | 11.4 | 21.0 | 2.4 |
| 1-10 | 12.2 | 21.5 | 2.6 |
| 1-11 | 9.1 | 20.9 | 1.9 |
| 1-12 | 11.0 | 19.1 | 2.1 |
| Comparison | | | |
| 1-1 | 8.8 | 16.0 | 1.4 |
| 1-2 | 7.9 | 14.0 | 1.1 |

After the stacks 20 of the examples 1-1 to 1-12 prepared as mentioned above underwent heat treatment at 250 degrees for 2 hours in a vacuum, the resistance and the magnitude of resistance change of each stack 20 were measured. Furthermore, the rate of resistance change was calculated in the following manner: the magnitude of resistance change was divided by the resistance and a resultant quotient was multiplied by 100. The results are shown in Table 1.

A stack was prepared as a comparison 1-1 to the examples under the same conditions as the conditions for the example 1-2 except that the high-resistance layer 28 was not provided. A stack was prepared as a comparison 1-2 under the same conditions as the conditions for the example 1-2, except that the high-resistance layer 28 was made of Al that was not oxidized, nitrided, or oxidized and nitrided. The resistance, the magnitude of resistance change and the rate of resistance change of each of the comparisons 1-1 and 1-2 were examined in the same manner as the examples. The results are also shown in Table 1.

As can be seen from Table 1, according to the examples, the rate of resistance change and the magnitude of resistance change of the examples were 9.1% or more and 1.9 $\Omega$ or more, respectively, which could be more than those of the comparison 1-1 in which the high-resistance layer 28 was not provided. The comparison 1-2, in which the high-resistance layer 28 was replaced with an Al layer having lower electrical resistance, only obtained about the same results as the results of the comparison 1-1. In other words, it has been shown that the provision of the high-resistance layer 28 allows increasing the rate of resistance change and the magnitude of resistance change. The rate of resistance change and the magnitude of resistance change of, in particular, the examples 1-1 to 1-10 are more than those of the examples 1-11 and 1-12. It has been therefore shown that, when the thickness of the second nonmagnetic layer 27 is from 0.5 nm to 2 nm inclusive, a higher rate of resistance change and a larger magnitude of resistance change can be obtained. It has been also apparent that high output can be obtained when the examples 1-1 to 1-10 are used in a thin film magnetic head, because the examples 1-1 to 1-10 in particular can obtain the magnitude of resistance change in excess of 2 Ω.

Examples 2-1 to 2-7

The stacks 60 shown in FIG. 16 were prepared as examples 2-1 to 2-7. As shown in Table 2, the ferromagnetic outer layers 631, the ferromagnetic inner layers 633 and the second nonmagnetic layers 27 had varying thicknesses, and the high-resistance layers 28 contained varying metals and had varying thicknesses. First, the underlayer 21 and the antiferromagnetic layer 22 were formed in sequence in the same manner as the examples 1-1 to 1-12. Next, the ferromagnetic outer layers 631 having thicknesses shown in Table 2 were formed of CoFe on the antiferromagnetic layers 22 by sputtering. The coupling layer 632 of 0.8 nm thick was formed of Ru on each ferromagnetic outer layer 631. The ferromagnetic inner layers 633 having thicknesses shown in Table 2 were formed of CoFe on the coupling layers 632. Subsequently, the first soft magnetic layer 25 and the second soft magnetic layer 26 were formed in sequence on each ferromagnetic inner layer 633 in the same manner as the examples 1-1 to 1-12. The second nonmagnetic layers 27 having thicknesses shown in Table 2 were formed of Cu on the second soft magnetic layers 26. The high-resistance layers 28 having thicknesses shown in Table 2 were formed on the second nonmagnetic layers 27 by oxidizing metal layers shown in Table 2. After that, the process of antiferromagnetizing took place using heat treatment.

TABLE 2

| | Thickness of ferromagnetic outer layer (nm) | Thickness of ferromagnetic inner layer (nm) | Thickness of second nonmagnetic layer (nm) |
|---|---|---|---|
| Example | | | |
| 2-1 | 1.5 | 2.5 | 1.2 |
| 2-2 | 2 | 2.5 | 1.2 |
| 2-3 | 2 | 3 | 1.2 |
| 2-4 | 2.5 | 2 | 1.2 |
| 2-5 | 1.5 | 2.5 | 1.0 |
| 2-6 | 1.5 | 2.5 | 0.6 |
| 2-7 | 2.5 | 2 | 0.5 |
| Comparison | | | |
| 2-1 | 1.5 | 2.5 | 1.2 |
| 2-2 | 2.5 | 1.5 | 1.2 |

TABLE 2-continued

| High-resistance layer | | Rate of resistance change (%) | Resistance (Ω) | Magnitude of resistance change (Ω) |
|---|---|---|---|---|
| Contained metal | Thickness (nm) | | | |
| Example | | | | |
| 2-1 | Al | 1 | 14.3 | 18.2 | 2.6 |
| 2-2 | Al | 1 | 12.9 | 19.4 | 2.5 |
| 2-3 | Al | 1 | 12.4 | 18.5 | 2.3 |
| 2-4 | Al | 1 | 12.9 | 17.8 | 2.3 |
| 2-5 | Al | 1 | 13.8 | 18.8 | 2.6 |
| 2-6 | Rh | 1 | 13.3 | 18.0 | 2.4 |
| 2-7 | Ru | 1.5 | 13.7 | 18.9 | 2.2 |
| Comparison | | | | |
| 2-1 | — | — | 8.7 | 15.0 | 1.3 |
| 2-2 | — | — | 7.8 | 15.3 | 1.2 |

The rate of resistance change, the resistance and the magnitude of resistance change of each of the stacks 60 of the examples 2-1 to 2-7 prepared as mentioned above were examined in the same manner as the examples 1-1 to 1-12. The results are shown in Table 2. A stack was prepared as a comparison 2-1 to the examples under the same conditions as the conditions for the example 2-1 except that the high-resistance layer 28 was not provided. A stack was prepared as a comparison 2-2 in the same manner as the comparison 2-1, except that the comparison 2-2 differed from the comparison 2-1 only in the thicknesses of the ferromagnetic outer layer and the ferromagnetic inner layer. The rate of resistance change, the resistance and the magnitude of resistance change of each of the comparisons 2-1 and 2-2 were examined in the same manner as the examples. The results are also shown in Table 2.

As can be seen from Table 2, according to the examples, the rate of resistance change and the magnitude of resistance change of the examples were 12.4% or more and 2.2 Ω or more, respectively, which could be more than those of the comparisons 2-1 and 2-2. In other words, it has been shown that, even in the stack 60 comprising the ferromagnetic layer 63 having a synthetic pin structure, the provision of the high-resistance layer 28 allows increasing the rate of resistance change and the magnitude of resistance change.

Examples 3-1 to 3-8

The stacks 70 shown in FIG. 17 were prepared as examples 3-1 to 3-8. As shown in Table 3, the ferromagnetic outer layers 631, the first inner layers 733a, the second inner layers 733b and the second nonmagnetic layers 27 had varying thicknesses, and the high-resistance layers 28 contained varying metals and had varying thicknesses. First, the underlayer 21 and the antiferromagnetic layer 22 were formed in sequence on an insulating substrate in the same manner as the examples 1-1 to 1-12. Next, the ferromagnetic outer layers 631 having thicknesses shown in Table 3 were formed of CoFe on the antiferromagnetic layers 22 by sputtering. The coupling layer 632 of 0.8 nm thick was formed of Ru on the ferromagnetic outer layer 631. The first inner layer 733a was formed of CoFe on the coupling layer 632. The thicknesses of the first inner layers 733a were set so that the oxidized first inner layers 733a might have thicknesses shown in Table 3, after previously allowing for the thickness of a part of the first inner layer 733a to be oxidized and changed into the interlayer 730 by the following oxidation.

Subsequently, the interlayer 730 of 1 nm thick was formed by oxidizing the first inner layer 733a. The thickness of the interlayer 730 was measured by the transmission electron microscope. After that, the second inner layer 733b was formed of CoFe on the interlayer 730 by sputtering. The first nonmagnetic layer 24, the first soft magnetic layer 25 and the second soft magnetic layer 26 were formed in sequence on the second inner layer 733b in the same manner as the examples 1-1 to 1-12. The second nonmagnetic layers 27 having thicknesses shown in Table 3 were formed of Cu on the second soft magnetic layers 26. The high-resistance layers 28 having thicknesses shown in Table 3 were formed on the second nonmagnetic layers 27 by oxidizing metal layers shown in Table 3. After that, the process of antiferromagnetizing took place using heat treatment.

TABLE 3

| | Thickness of ferromagnetic outer layer (nm) | Thickness of first inner layer (nm) | Thickness of second inner layer (nm) | Thickness of second nonmagnetic layer (nm) |
|---|---|---|---|---|
| Example | | | | |
| 3-1 | 2 | 1.5 | 1.5 | 1.2 |
| 3-2 | 2 | 1.5 | 1.5 | 1.2 |
| 3-3 | 2 | 1.5 | 1.5 | 1.2 |
| 3-4 | 2 | 1.5 | 1.5 | 1.0 |
| 3-5 | 2 | 1.5 | 1.5 | 1.0 |
| 3-6 | 2 | 1.5 | 1.5 | 1.1 |
| 3-7 | 2 | 1.5 | 1.5 | 1.0 |
| 3-8 | 2.5 | 2.0 | 2.0 | 1.1 |
| Comparison | | | | |
| 3-1 | 2 | 1.5 | 1.5 | 1.2 |
| 3-2 | 1.5 | 1.5 | 1.5 | 1.2 |

| | High-resistance layer | | Rate of resistance change (%) | Resistance (Ω) | Magnitude of resistance change (Ω) |
|---|---|---|---|---|---|
| | Contained metal | Thickness (nm) | | | |
| Example | | | | | |
| 3-1 | Al | 1 | 16.0 | 18.8 | 3.0 |
| 3-2 | Cr | 1.2 | 14.6 | 19.9 | 2.9 |
| 3-3 | Fe | 1 | 14.2 | 19.0 | 2.7 |
| 3-4 | Ru | 1.2 | 13.8 | 18.1 | 2.5 |
| 3-5 | Ag | 1 | 16.0 | 19.0 | 3.0 |
| 3-6 | Mn | 1.2 | 14.8 | 18.9 | 2.8 |
| 3-7 | Ti | 1.2 | 14.4 | 18.0 | 2.6 |
| 3-8 | Ru | 1.5 | 13.3 | 19.6 | 2.6 |
| Comparison | | | | | |
| 3-1 | — | — | 9.4 | 15.9 | 1.5 |
| 3-2 | — | — | 9.9 | 16.2 | 1.6 |

The rate of resistance change, the resistance and the magnitude of resistance change of each of the stacks 70 of the examples 3-1 to 3-8 prepared as mentioned above were examined in the same manner as the examples 1-1 to 1-12. The results are shown in Table 3. A stack was prepared as a comparison 3-1 to the examples under the same conditions as the conditions for the examples 3-1 to 3-3 except that the high-resistance layer 28 was not provided. A stack was prepared as a comparison 3-2 in the same manner as the comparison 3-1, except that the comparison 3-2 differed from the comparison 3-1 only in the thickness of the ferromagnetic outer layer. The rate of resistance change, the resistance and the magnitude of resistance change of each of the comparisons 3-1 and 3-2 were examined in the same manner as the examples. The results are also shown in Table 3.

As can be seen from Table 3, according to the examples, the rate of resistance change and the magnitude of resistance change of the examples were 13.3% or more and 2.5 Ω or more, respectively, which could be more than those of the comparisons 3-1 and 3-2. In other words, it has been shown that, even in the stack 70 comprising the ferromagnetic layer 73 having a synthetic structure and the interlayer 730, the provision of the high-resistance layer 28 allows increasing the rate of resistance change and the magnitude of resistance change. According to the examples 3-1 to 3-8, the rate of resistance change and the magnitude of resistance change of the examples 3-1 to 3-8 were more than those of the examples 1-1 to 1-12. In other words, it has been shown that the provision of the interlayer 730 allows further increasing the rate of resistance change and the magnitude of resistance change.

Examples 4-1 to 4-10

The stacks 70 shown in FIG. 17 were prepared as examples 4-1 to 4-8 in the same manner as the examples 3-1 to 3-8. As shown in Table 4, the ferromagnetic outer layers 631, the first inner layers 733a, the second inner layers 733b and the second nonmagnetic layers 27 had varying thicknesses, and the high-resistance layers 28 contained varying metals and had varying thicknesses. The stack 60 shown in FIG. 16 was prepared as an example 4-9 in the same manner as the example 2-7, and the stack 20 shown in FIG. 7 was prepared as an example 4-10 in the same manner as the example 1-7. After the stacks of the examples 4-1 to 4-10 prepared as mentioned above were subjected to heat treatment at 250 degrees for 2 hours in a vacuum, the rate of resistance change, the resistance and the magnitude of resistance change of each stack were measured, and the measured values were taken as initial properties values. Next, after the stacks were subjected to heat treatment at 250 degrees for another 50 hours in a vacuum, the rate of resistance change, the resistance and the magnitude of resistance change of each stack were measured. The results are shown in Table 5.

TABLE 4

| | Thickness of ferromagnetic outer layer (nm) | Thickness of first inner layer (nm) | Thickness of second inner layer (nm) | Thickness of second nonmagnetic layer (nm) |
|---|---|---|---|---|
| Example | | | | |
| 4-1 | 2 | 1.5 | 1.5 | 1.2 |
| 4-2 | 2 | 1.5 | 1.5 | 1.2 |
| 4-3 | 2 | 1.5 | 1.5 | 1.2 |
| 4-4 | 2 | 1.5 | 1.5 | 1.0 |
| 4-5 | 2 | 1.5 | 1.5 | 1.0 |
| 4-6 | 2 | 1.5 | 1.5 | 1.1 |
| 4-7 | 2 | 1.5 | 1.5 | 1.0 |
| 4-8 | 2.5 | 2.0 | 2.0 | 1.0 |
| 4-9 | 2.5 | 2.0 | — | 0.5 |
| 4-10 | 2.0 | — | — | 1.3 |
| Comparative | | | | |
| 4-1 | 1.5 | 1.5 | 1.5 | 1.2 |
| 4-2 | 1.5 | 2.0 | — | 1.2 |
| 4-3 | 2.0 | — | — | 1.3 |
| 4-4* | — | — | 2 | — |
| 4-5** | 2.0 | 2.6 | — | 1 |

TABLE 4-continued

| | High-resistance layer | |
|---|---|---|
| | Contained metal | Thickness (nm) |
| Example | | |
| 4-1 | Al | 1 |
| 4-2 | Cr | 1.2 |
| 4-3 | Fe | 1 |
| 4-4 | Ru | 1.2 |
| 4-5 | Ag | 1 |
| 4-6 | Mn | 1.2 |
| 4-7 | Ti | 1.2 |
| 4-8 | Cu | 1.5 |
| 4-9 | Ru | 1.5 |
| 4-10 | Cr | 1.8 |
| Comparison | | |
| 4-1 | — | — |
| 4-2 | — | — |
| 4-3 | — | — |
| 4-4* | Co, Fe | 1 |
| 4-5** | — | — |

\* Comparison 4-4

The antiferromagnetic layer was made of IrMn (8 nm), the soft magnetic layer was made of CoFe (3 nm), and the cap layer was made of TaO (5 nm).

\*\* Comparison 4-5

The antiferromagnetic layer was made of PtMn (25 nm), the coupling layer was made of Ru (0.85 nm), and the soft magnetic layer was made of CoFe (1 nm) and NiFe (2 nm).

TABLE 5

| | Before heat treatment | | |
|---|---|---|---|
| | Rate of resistance change (%) | Resistance ($\Omega$) | Magnitude of resistance change ($\Omega$) |
| Example | | | |
| 4-1 | 16.0 | 18.8 | 3.0 |
| 4-2 | 14.6 | 19.9 | 2.9 |
| 4-3 | 14.2 | 19.0 | 2.7 |
| 4-4 | 13.8 | 18.1 | 2.5 |
| 4-5 | 16.0 | 19.0 | 3.0 |
| 4-6 | 14.8 | 18.9 | 2.8 |
| 4-7 | 14.4 | 18.0 | 2.6 |
| 4-8 | 13.3 | 19.6 | 2.6 |
| 4-9 | 11.6 | 18.9 | 2.2 |
| 4-10 | 14.0 | 18.6 | 2.6 |
| Comparison | | | |
| 4-1 | 9.9 | 16.2 | 1.6 |
| 4-2 | 8.7 | 15.0 | 1.3 |
| 4-3 | 7.9 | 14.0 | 1.1 |
| 4-4 | 16.6 | 22.9 | 3.8 |
| 4-5 | 10.1 | 14.8 | 1.5 |
| | After heat treatment | | |
| | Rate of resistance change (%) | Resistance ($\Omega$) | Magnitude of resistance change ($\Omega$) |
| Example | | | |
| 4-1 | 14.7 | 19.0 | 2.8 |
| 4-2 | 13.9 | 20.2 | 2.8 |
| 4-3 | 12.6 | 19.8 | 2.5 |
| 4-4 | 12.4 | 18.6 | 2.3 |
| 4-5 | 14.4 | 19.4 | 2.8 |
| 4-6 | 13.5 | 19.3 | 2.6 |
| 4-7 | 13.1 | 18.3 | 2.4 |
| 4-8 | 12.1 | 19.9 | 2.4 |
| 4-9 | 10.5 | 20.0 | 2.1 |
| 4-10 | 12.6 | 19.0 | 2.4 |
| Comparison | | | |
| 4-1 | 6.4 | 18.8 | 1.2 |
| 4-2 | 6.5 | 17.0 | 1.1 |
| 4-3 | 5.8 | 15.6 | 0.9 |
| 4-4 | 6.2 | 26.0 | 1.6 |
| 4-5 | 7.1 | 16.9 | 1.2 |

A stack was prepared as a comparison 4-1 in the same manner as the comparison 3-1, a stack was prepared as a comparison 4-2 in the same manner as the comparison 2-1, and a stack was prepared as a comparison 4-3 in the same manner as the comparison 1-1. The rate of resistance change, the resistance and the magnitude of resistance change of each of the comparisons 4-1 to 4-3 were measured in the same manner as the examples. The results are also shown in Table 5.

Figure 18:
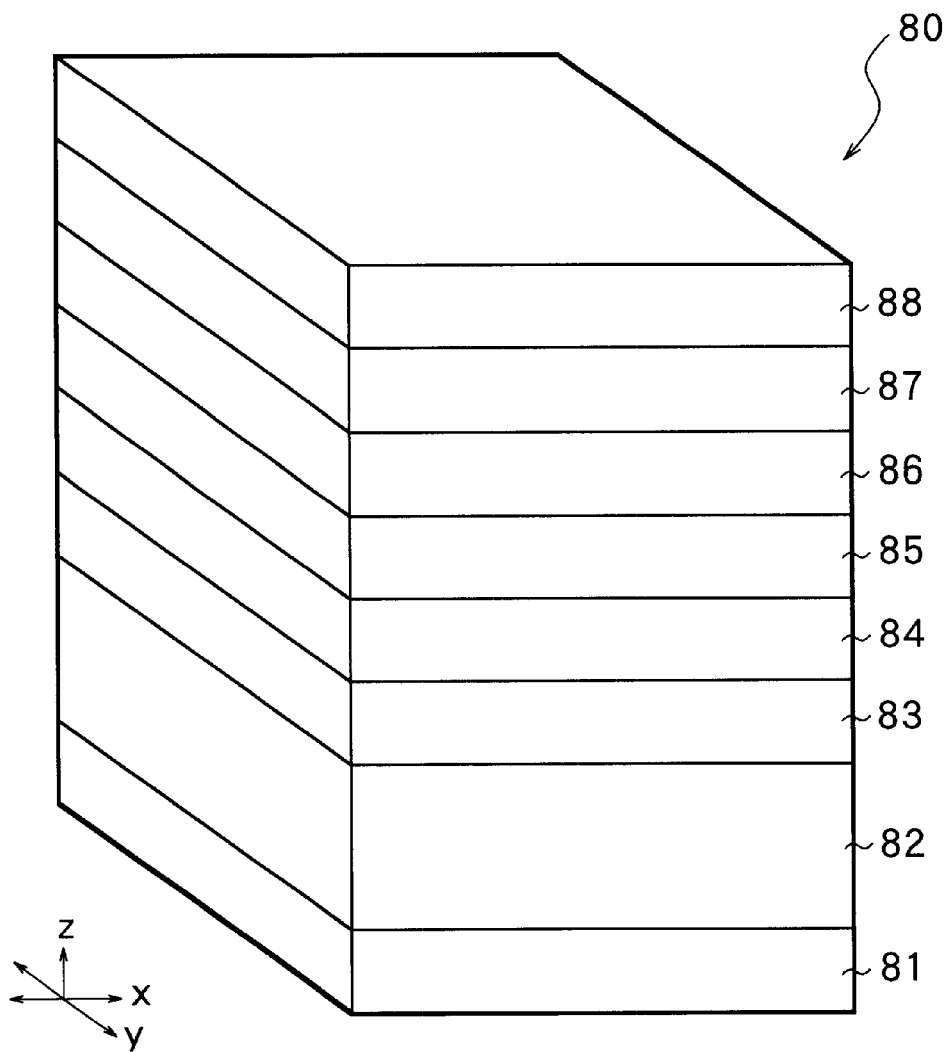
FIG. 18 is a perspective view of a structure of a stack according to a comparison.

Furthermore, a stack 80 shown in FIG. 18 was prepared as a comparison 4-4 according to the description of the cited reference "CoFe specular spin valves with a nano oxide layer", 1999 Digests of INTERMAG 99, published on May 18, 1999. First, a Ta film of 3 nm thick and a NiFe film of 2 nm thick were formed in sequence on an insulating substrate made of $Al_2O_3$—TiC on which an $Al_2O_3$ film was formed, and thus an underlayer 81 was formed. An antiferromagnetic layer 82 of 8 nm thick was formed of IrMn on the underlayer 81. Since IrMn was a non-heat-treatment type antiferromagnetic material, the antiferromagnetic layer 82 was formed with a magnetic field applied. Next, a metal layer of 1 nm thick was formed of CoFe on the antiferromagnetic layer 82, and an oxide layer (NOL) 83 of 1 nm thick was formed by oxidizing the metal layer. Subsequently, a ferromagnetic layer 84 of 1 nm thick was formed of CoFe on the oxide layer 83, a nonmagnetic layer 85 of 2.4 nm thick was formed of Cu on the ferromagnetic layer 84, and a soft magnetic layer 86 of 3 nm thick was formed of CoFe on the nonmagnetic layer 85. The thickness of the soft magnetic layer 86 was set so that the oxidized soft magnetic layer 86 might have a thickness of 3 nm, after previously allowing for the thickness of a part of the soft magnetic layer 86 to be changed into an oxide film by the following oxidation. Then, an oxide film 87 made of CoFeO was formed by oxidizing a surface of the soft magnetic layer 86, and a cap layer 88 of 5 nm thick was formed of Ta on the oxide film 87. The layers, exclusive of the oxide layer 83 and the oxide film 87, were formed by using sputtering.

Figure 19:
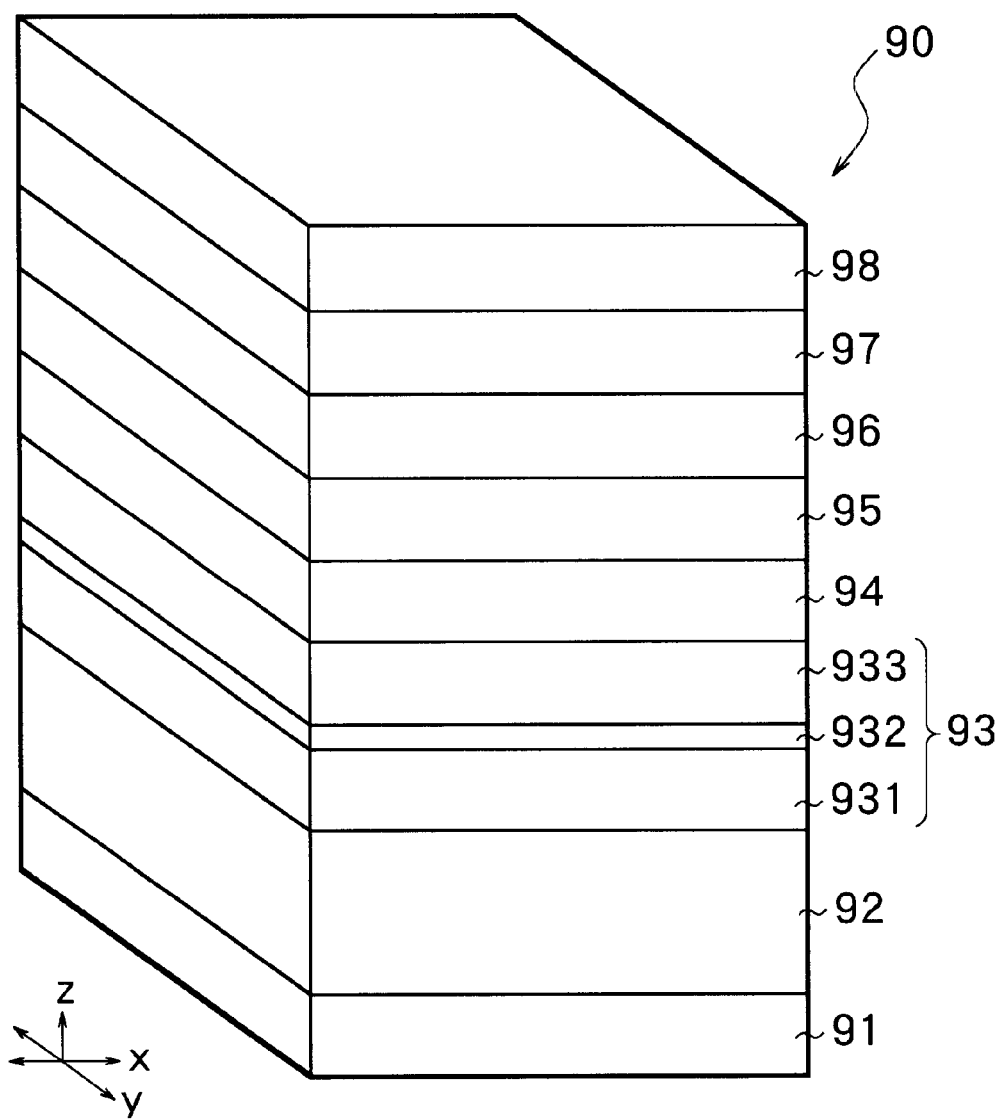
FIG. 19 is a perspective view of a structure of a stack according to another comparison.
Figure 20:
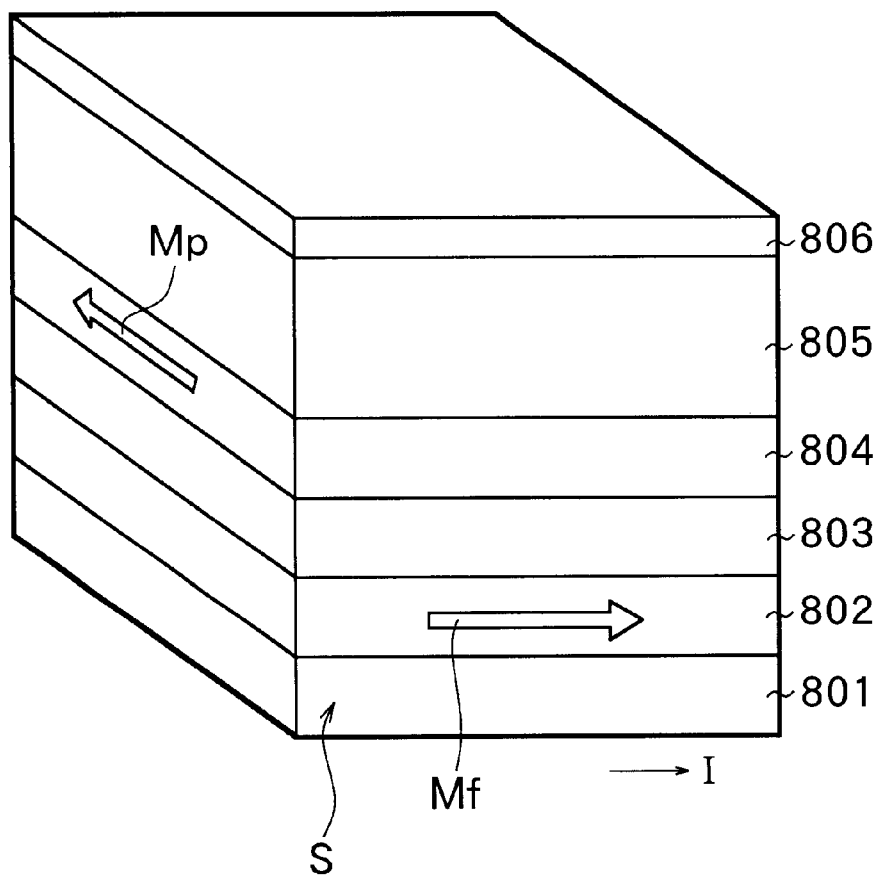
FIG. 20 is a perspective view of a structure of a stack of a conventional magnetic transducer.

In addition, a stack 90 shown in FIG. 19 was prepared as a comparison 4-5 according to the description of the cited reference "Read-write performance of the spin-filter-spin-valve heads", p. 402, the Proceedings of the Annual Meeting of THE MAGNETICS SOCIETY OF JAPAN. First, a Ta film of 3 nm thick and a NiFe film of 2 nm thick were formed in sequence on an insulating substrate made of $Al_2O_3$—TiC on which an $Al_2O_3$ film was formed, and thus an underlayer 91 was formed. An antiferromagnetic layer 92 of 25 nm thick was formed of PtMn on the underlayer 91, and an ferromagnetic outer layer 931 of 1 nm thick was formed of CoFe on the antiferromagnetic layer 92. A coupling layer 932 of 0.85 nm thick was formed of Ru on the ferromagnetic outer layer 931, an ferromagnetic inner layer 933 was formed of CoFe on the coupling layer 932, and a nonmagnetic layer 94 of 2.4 nm thick was formed of Cu on the ferromagnetic inner layer 933. A first soft magnetic layer 95 of 1 nm thick was formed of CoFe on the nonmagnetic layer 94. A second soft magnetic layer 96 of 2 nm thick was formed of NiFe on the first soft magnetic layer 95. A second nonmagnetic layer 97 of 1 nm thick was formed of Cu on the second soft magnetic layer 96. A cap layer 98 of 3 nm thick was formed of Ta on the second nonmagnetic layer 97. The layers, exclusive of the oxide layer 83 and the oxide film 87, were formed by using sputtering. Since a heat-treatment type antiferromagnetic material was used to form the antiferromagnetic layer 92, the process of antiferromagnetizing took place using heat treatment after forming the layer.

The rate of resistance change, the resistance and the magnitude of resistance change of each of the comparisons 4-4 and 4-5 were measured in the same manner as the examples. The results are also shown in Table 5.

As can be seen from Table 5, the rate of resistance change and the magnitude of resistance change of the examples after 50-hour heating were 10.5% or more and 2.1 Ω or more, respectively, which were more than those of the comparisons 4-1 to 4-5. In other words, it has been shown that, according to the examples, high thermal stability can be obtained.

Thin film heads described by referring to the above-mentioned embodiments were prepared by using the examples 4-1, 4-9 and 4-10 of the above-mentioned examples, and properties of the thin film heads were measured. The results are shown in Table 6. Track widths, resistance and MR heights of the stacks 50, 60 and 70 of the prepared thin film heads are as shown in Table 6. Head output, standardized output, asymmetry and an output covariant value (COV) were calculated as the properties of the thin film heads. The standardized output corresponds to head output in a unit length of the track width. The output covariant value was calculated in the following manner: Read-write cycles were repeated 100 times. A standard deviation σ (sigma) of variation in head output value in each cycle was divided by an average value of head outputs, thereby the output covariant value was acquired. Asymmetry Asym, a constant for evaluating the asymmetry, was calculated by the following Equation (1) from an absolute value V1 of a plus peak voltage and an absolute value V2 of a minus peak voltage of voltage output of the thin film magnetic head.

$$\text{Asym}(\%) = (V1-V2)/(V1+V2) \times 100 \qquad (1)$$

TABLE 6

| | MR track width (μm) | Resistance (Ω) | MR height (μm) | Head output (μV) |
|---|---|---|---|---|
| Example | | | | |
| 4-1 | 0.36 | 46.8 | 0.45 | 2430 |
| 4-9 | 0.38 | 45.3 | 0.42 | 2105 |
| 4-10 | 0.34 | 48.2 | 0.4 | 1800 |
| Comparison | | | | |
| 4-2 | 0.40 | 45.1 | 0.41 | 910 |
| 4-3 | 0.37 | 46.4 | 0.46 | 925 |

| | Standardized output (μV/μm) | Asym (%) | COV (%) | Standardized output after annealing (μV/μm) |
|---|---|---|---|---|
| Example | | | | |
| 4-1 | 6750 | 0.2 | 0.5 | 6590 |
| 4-9 | 5539 | -0.5 | 0.6 | 5480 |
| 4-10 | 5294 | -0.8 | 0.9 | 5210 |

TABLE 6-continued

| Comparison | | | | |
|---|---|---|---|---|
| 4-2 | 2275 | -6.5 | 2.5 | 1800 |
| 4-3 | 2500 | -1.3 | 2.0 | 2150 |

Thin film heads were prepared in the same manner by using the comparisons 4-2 and 4-3, and properties of the thin film heads were examined. The results are also shown in Table 6. The track widths, the resistance and the MR heights of the stacks of the prepared thin film heads are as shown in Table 6.

As can be seen from Table 6, according to the examples, the standardized head output exceeding 5000 μV could be obtained. Moreover, the asymmetry could be closer to 0, and the output covariant value could be as small as less than 1.0. In other words, it has been shown that, according to the examples, high output can be obtained and stable output waveform can be obtained. More particularly, it has been shown that the examples 4-1 and 4-9 each having a synthetic structure have good output asymmetry. Furthermore, it has been shown that the example 4-1 having a synthetic structure and the interlayer 730 can obtain higher standardized output.

The above-mentioned examples have been specifically described by referring to some examples. However, even a stack having any other structure can obtain the same results, as long as a nonmagnetic layer and a high-resistance layer are provided in this order on the side of a soft magnetic layer close to a ferromagnetic layer and the opposite side thereof, respectively.

Although the invention has been described above by referring to some embodiments and examples, the invention is not limited to these embodiments and examples and various modifications of the invention are possible. For example, although the description has been given with regard to the case in which the soft magnetic layer has a two-layer structure comprising the first soft magnetic layer and the second soft magnetic layer, the soft magnetic layer may have a single-layer structure or a stacked structure comprising three layers or more.

The magnetic domain controlling ferromagnetic films 31a and 31b and the magnetic domain controlling antiferromagnetic films 32a and 32b may be replaced with a hard magnetic material (a hard magnet) as the magnetic domain control films 30a and 30b shown in FIG. 6. In this case, a stacked film of a TiW (titanium-tungsten alloy) layer and a CoPt (cobalt-platinum alloy) layer, a stacked film of a TiW layer and a CoCrPt (cobalt-chromium-platinum alloy) layer, or the like can be used.

In the above-mentioned embodiments, both the antiferromagnetic layer 22 and the magnetic domain controlling antiferromagnetic films 32a and 32b are made of the heat-treatment type antiferromagnetic material. However, the antiferromagnetic layer 22 and the magnetic domain controlling antiferromagnetic films 32a and 32b may be made of the heat-treatment type antiferromagnetic material and the non-heat-treatment type antiferromagnetic material, respectively. Alternatively, the antiferromagnetic layer 22 and the magnetic domain controlling antiferromagnetic films 32a and 32b may be made of the non-heat-treatment type antiferromagnetic material and the heat-treatment type antiferromagnetic material, respectively. Alternatively, both the antiferromagnetic layer 22 and the magnetic domain controlling antiferromagnetic films 32a and 32b may be made of the non-heat-treatment type antiferromagnetic material.

In the above-mentioned embodiments, the description has been given with regard to the case in which the magnetic transducer of the invention is used in a composite thin film magnetic head. However, the magnetic transducer of the invention can be also used in a thin film magnetic head for reproducing only. Moreover, the recording head and the reproducing head may be stacked in reverse order.

Additionally, the structure of the magnetic transducer of the invention may be applied to a tunnel junction type magnetoresistive film (a TMR film). Furthermore, the magnetic transducer of the invention is applicable to, for example, a sensor (an accelerometer or the like) for detecting a magnetic signal, a memory for storing a magnetic signal, or the like, as well as the thin film magnetic head described by referring to the above-mentioned embodiments.

As described above, according to a magnetic transducer or a thin film magnetic head of the invention, the high-resistance layer is located on the second nonmagnetic layer on the side opposite to the soft magnetic layer and is made of a material having resistivity of 200 $\mu\Omega\cdot$cm or more. According to another thin film magnetic head of the invention, one gap layer is located on the second nonmagnetic layer and is made of a material having resistivity of 200 $\mu\Omega\cdot$cm or more. Therefore, the rate of resistance change and the magnitude of resistance change can be increased while stability of properties being improved, and furthermore high thermal stability can be obtained.

When the high-resistance layer contains at least one element in a group consisting of Al, Cr, Ti, Ru, Mn, Rh, Ag, Pd, Ni, Cu, Co, Fe, Re and Ta, and at least one element in a group consisting of O and N, thermal stability can be further improved.

When the ferromagnetic layer includes a ferromagnetic inner layer, an ferromagnetic outer layer, and a coupling layer sandwiched between the ferromagnetic inner layer and the ferromagnetic outer layer, or when the ferromagnetic layer can have two magnetizations which are opposite each other in direction, output symmetry can be improved.

When a magnetic interlayer having higher electrical resistance than that of at least a part of the ferromagnetic layer is provided in the ferromagnetic layer, the rate of resistance change and the magnitude of resistance change can be further increased.

Obviously many modifications and variations of the present invention are possible in the light of the above teachings. It is therefore to be understood that within the scope of the appended claims the invention may be practiced otherwise than as specifically described.

What is claimed is:

1. A magnetic transducer, comprising:

an antiferromagnetic layer formed on a base body;

a ferromagnetic layer formed on the antiferromagnetic layer;

a first nonmagnetic layer formed on the ferromagnetic layer;

a soft magnetic layer formed on the first nonmagnetic layer;

a second nonmagnetic layer formed on the soft magnetic layer; and a high-resistance layer formed on the second nonmagnetic layer and made of a material having resistivity of 200 $\mu\Omega\cdot$cm or more, wherein the layers are formed in order.

2. A magnetic transducer according to claim 1, wherein the high-resistance layer contains at least one element in a group consisting of aluminum (Al), chromium (Cr), titanium (Ti), ruthenium (Ru), manganese (Mn), rhodium (Rh), silver (Ag), palladium (Pd), nickel (Ni), copper (Cu), cobalt (Co), iron (Fe), rhenium (Re) and tantalum (Ta), and at least one element in a group consisting of oxygen (O) and nitrogen (N).

3. A magnetic transducer according to claim 2, wherein the high-resistance layer contains at least one element in a group consisting of aluminum, chromium, titanium, ruthenium, manganese and rhodium.

4. A magnetic transducer according to claim 1, wherein a thickness of the high-resistance layer is from 0.5 nm to 30 nm inclusive.

5. A magnetic transducer according to claim 1, wherein the second nonmagnetic layer contains at least one element in a group consisting of gold (Au), silver, copper, ruthenium, rhodium, rhenium, platinum (Pt) and tungsten (W).

6. A magnetic transducer according to claim 1, wherein a thickness of the second nonmagnetic layer is from 0.5 um to 2 nm inclusive.

7. A magnetic transducer according to claim 1, wherein the ferromagnetic layer includes a ferromagnetic inner layer, an ferromagnetic outer layer, and a coupling layer sandwiched between the ferromagnetic inner layer and the ferromagnetic outer layer.

8. A magnetic transducer according to claim 1, wherein the ferromagnetic layer can have two magnetizations which are opposite each other in direction.

9. A magnetic transducer according to claim 1, wherein a magnetic interlayer having higher electrical resistance than that of at least a part of the ferromagnetic layer is provided in the ferromagnetic layer.

10. A magnetic transducer according to claim 1, wherein a thickness of the soft magnetic layer is from 1 nm to 6 nm inclusive.

11. A thin film magnetic head having a magnetic transducer according to claim 1.

12. A thin film magnetic head having a magnetic transducer between a pair of magnetic layers with a pair of gap layers in between, the magnetic transducer comprising:

an antiferromagnetic layer formed on a base body;

a ferromagnetic layer formed on the antiferromagnetic layer;

a first nonmagnetic layer formed on the ferromagnetic layer;

a soft magnetic layer formed on the first nonmagnetic layer; and a second nonmagnetic layer formed on the soft magnetic layer;

wherein one of the pair of gap layers is located on the second nonmagnetic layer and is made of a material having resistivity of 200 $\mu\Omega\cdot$cm or more, and the layers are formed in order.

* * * * *